(12) United States Patent
Zhang et al.

(10) Patent No.: US 10,431,313 B2
(45) Date of Patent: Oct. 1, 2019

(54) GROUPING MEMORY CELLS INTO SUB-BLOCKS FOR PROGRAM SPEED UNIFORMITY

(71) Applicant: SanDisk Technologies LLC, Plano, TX (US)

(72) Inventors: Zhengyi Zhang, Mountain View, CA (US); Yingda Dong, San Jose, CA (US); James Kai, Santa Clara, CA (US); Johann Alsmeier, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/923,064

(22) Filed: Mar. 16, 2018

(65) Prior Publication Data

US 2018/0240527 A1 Aug. 23, 2018

Related U.S. Application Data

(62) Division of application No. 15/437,718, filed on Feb. 21, 2017, now Pat. No. 9,959,932.

(51) Int. Cl.
| | | |
|---|---|---|
| *G11C 16/04* | (2006.01) | |
| *G11C 16/34* | (2006.01) | |
| *G11C 16/10* | (2006.01) | |
| *G11C 16/28* | (2006.01) | |

(52) U.S. Cl.
CPC ...... *G11C 16/3427* (2013.01); *G11C 16/0483* (2013.01); *G11C 16/10* (2013.01); *G11C 16/28* (2013.01); *G11C 16/3459* (2013.01)

(58) Field of Classification Search
USPC .................................................. 365/185.11
See application file for complete search history.

(56) References Cited

U.S. PATENT DOCUMENTS

| | | |
|---|---|---|
| 8,310,870 B2 | 11/2012 | Dutta et al. |
| 8,982,626 B2 | 3/2015 | Dong et al. |
| 9,015,407 B1 | 4/2015 | Dusija et al. |

(Continued)

OTHER PUBLICATIONS

International Search Report & The Written Opinion of the International Searching Authority dated Feb. 20, 2018, International Application No. PCT/US2017/063464.

(Continued)

*Primary Examiner* — Min Huang
(74) *Attorney, Agent, or Firm* — Vierra Magen Marcus LLP

(57) ABSTRACT

A three-dimensional stacked memory device is configured to provide uniform programming speeds of different sets of memory strings formed in memory holes. In a process for removing sacrificial material from word line layers, a block oxide layer in the memory holes is etched away relatively more when the memory hole is relatively closer to an edge of the word line layers where an etchant is introduced. A thinner block oxide layer is associated with a faster programming speed. To compensate, memory strings at the edges of the word line layers are programmed together, separate from the programming of interior memory strings. A program operation can use a higher initial program voltage for programming the interior memory strings compared to the edge memory strings.

19 Claims, 17 Drawing Sheets

(56) References Cited

U.S. PATENT DOCUMENTS

| | | | |
|---|---|---|---|
| 9,343,156 B1 | 5/2016 | Mui et al. | |
| 9,812,462 B1 | 11/2017 | Pang et al. | |
| 9,959,932 B1* | 5/2018 | Zhang | G11C 16/3427 |
| 2005/0083735 A1 | 4/2005 | Chen et al. | |
| 2010/0232224 A1* | 9/2010 | Maeda | G11C 16/0483 |
| | | | 365/185.18 |
| 2013/0028027 A1 | 1/2013 | Kim et al. | |
| 2014/0362645 A1 | 12/2014 | Dong et al. | |
| 2016/0071870 A1 | 3/2016 | Minami et al. | |
| 2016/0372202 A1* | 12/2016 | Suzuki | G11C 16/10 |
| 2017/0040061 A1* | 2/2017 | Yeh | G11C 16/14 |
| 2017/0255742 A1* | 9/2017 | Lee | H01L 27/115 |

OTHER PUBLICATIONS

U.S. Appl. No. 15/437,718, filed Feb. 21, 2017, by Zhang et al.
Restriction Requirement dated Aug. 17, 2017, U.S. Appl. No. 15/437,718, filed Feb. 21, 2017.
Response to Restriction Requirement dated Sep. 6, 2017, U.S. Appl. No. 15/437,718, filed Feb. 21, 2017.
Non-final Office Action dated Sep. 28, 2017, U.S. Appl. No. 15/437,718, filed Feb. 21, 2017.
Response to Office Action dated Dec. 6, 2017, U.S. Appl. No. 15/437,718, filed Feb. 21, 2017.
Notice of Allowance dated Feb. 15, 2018, U.S. Appl. No. 15/437,718, filed Feb. 21, 2017.

* cited by examiner

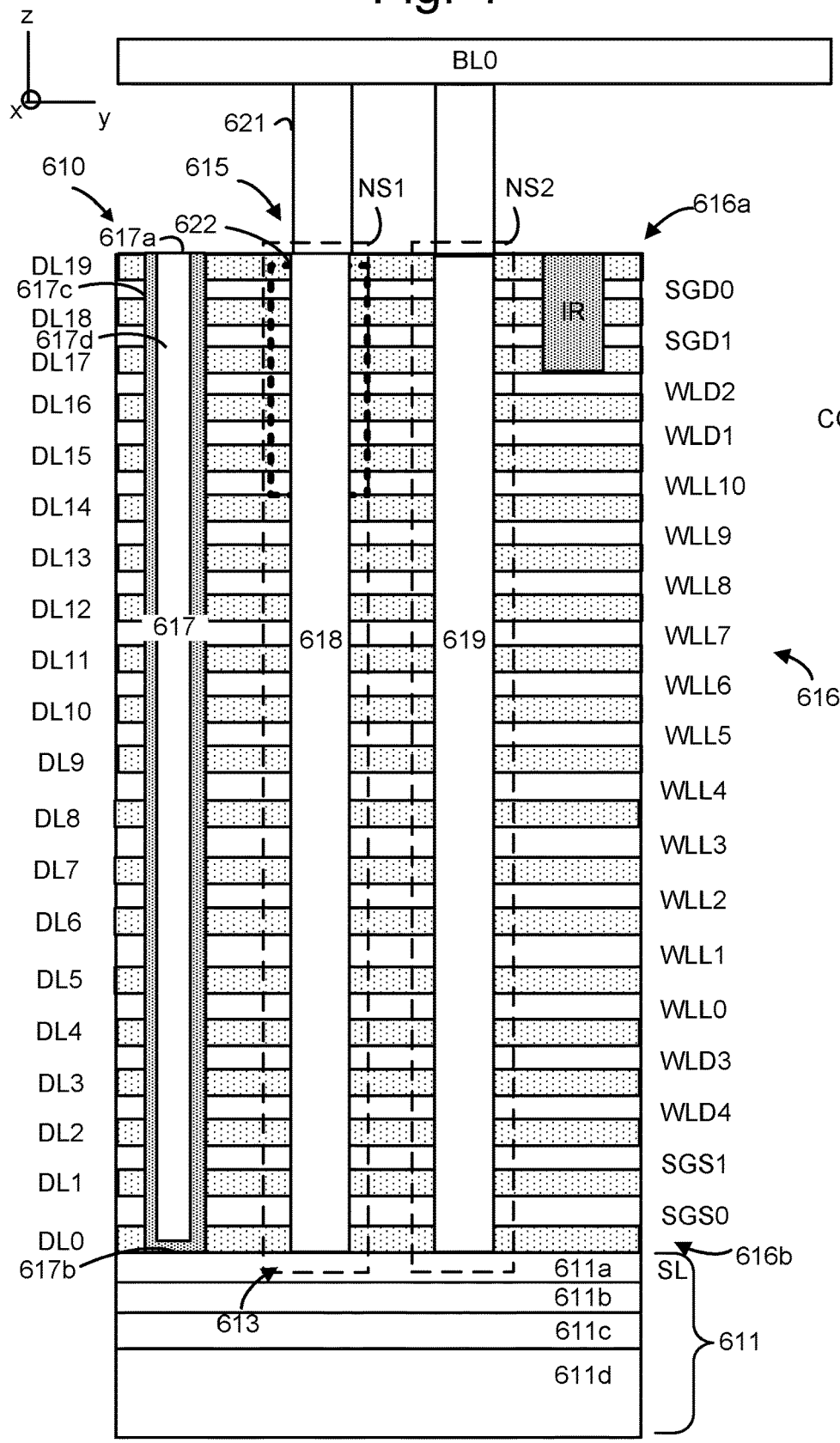

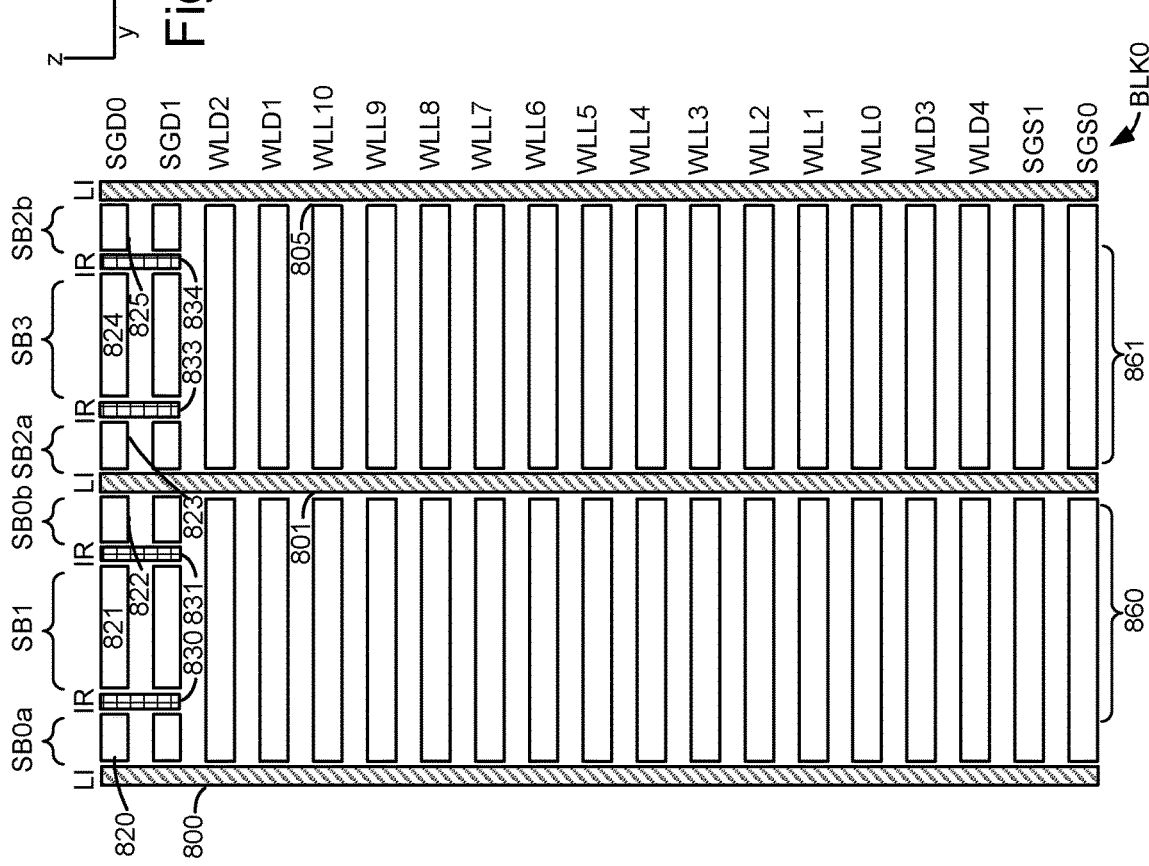

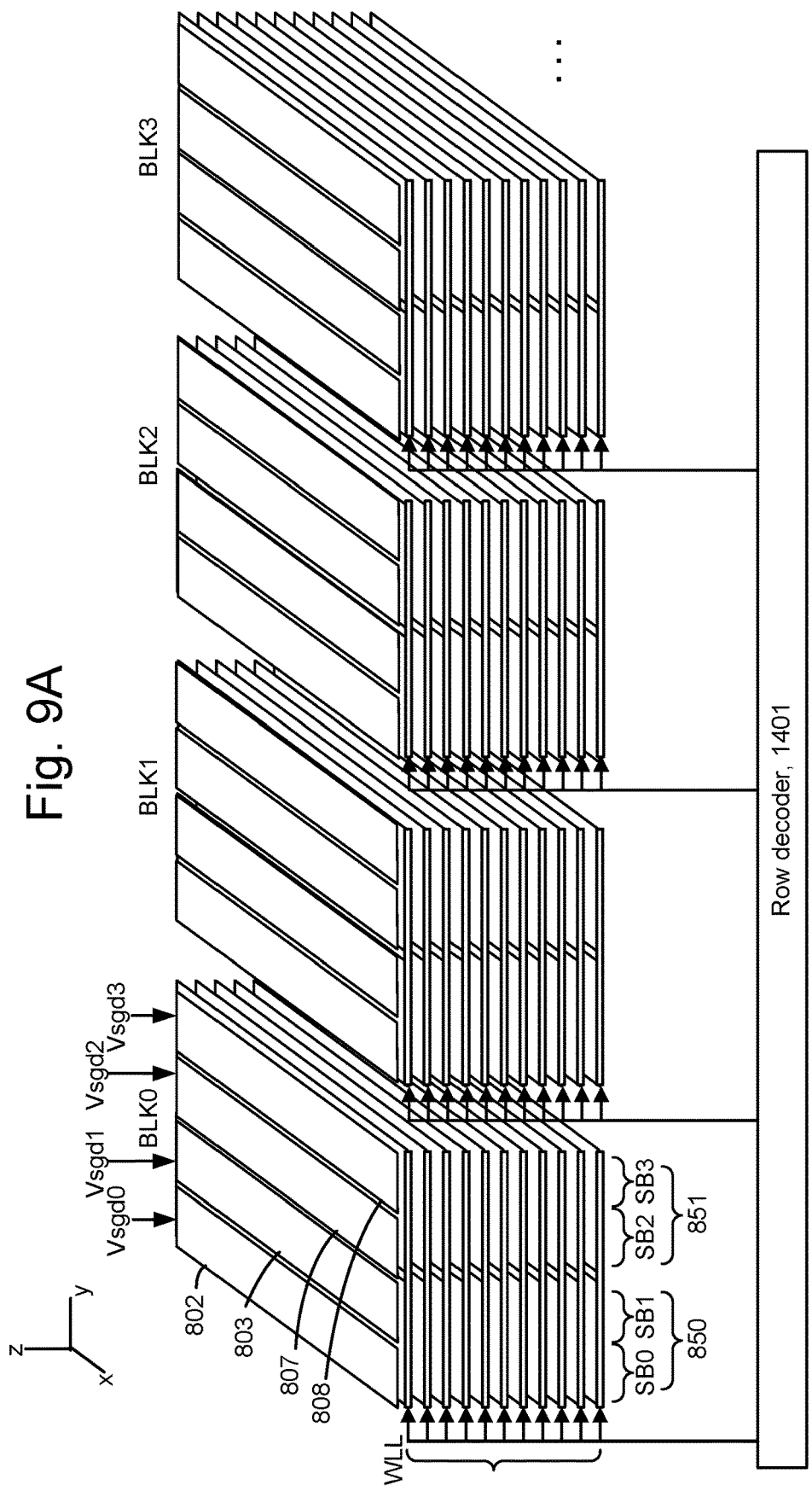

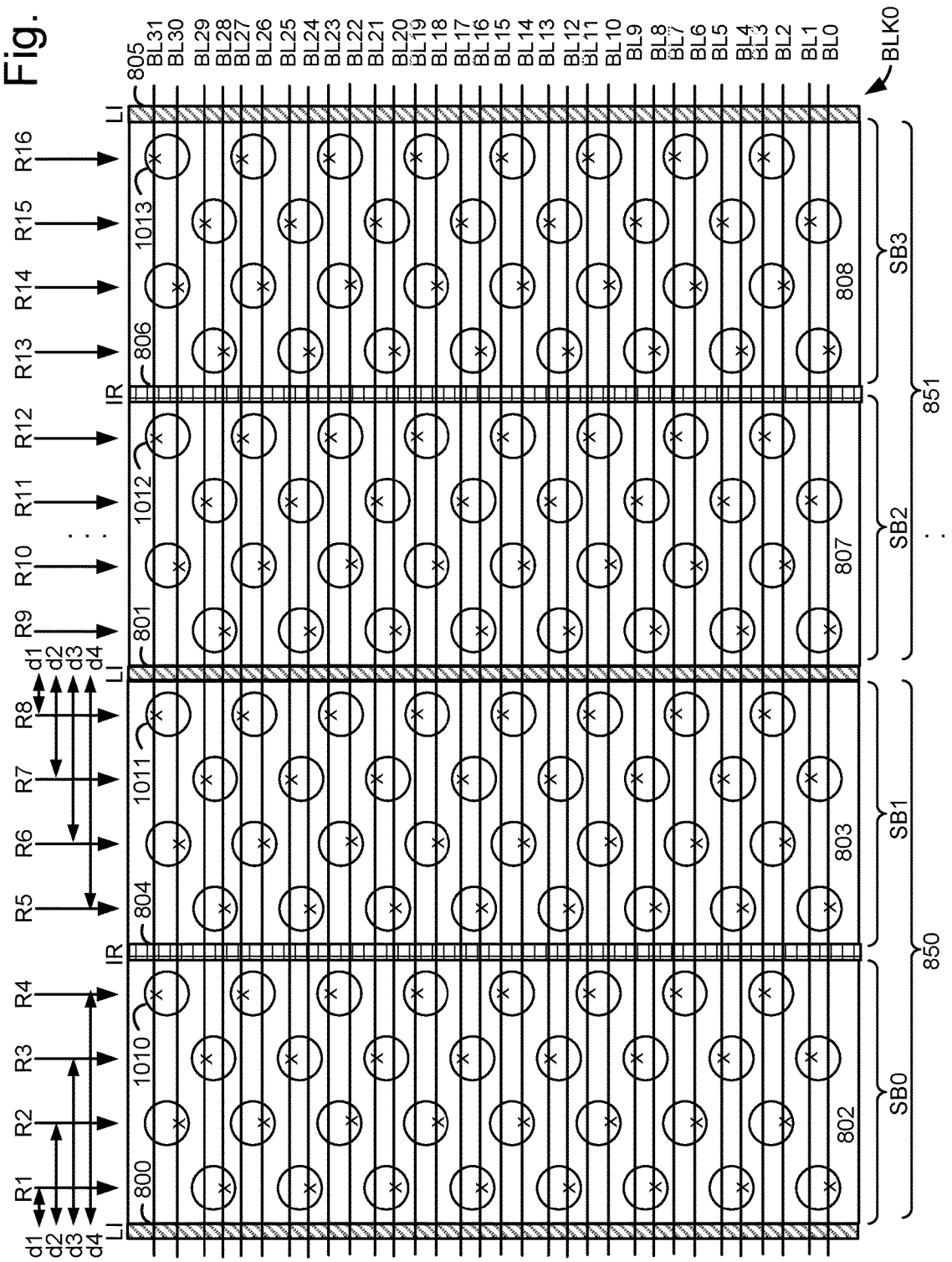

Fig. 10B1

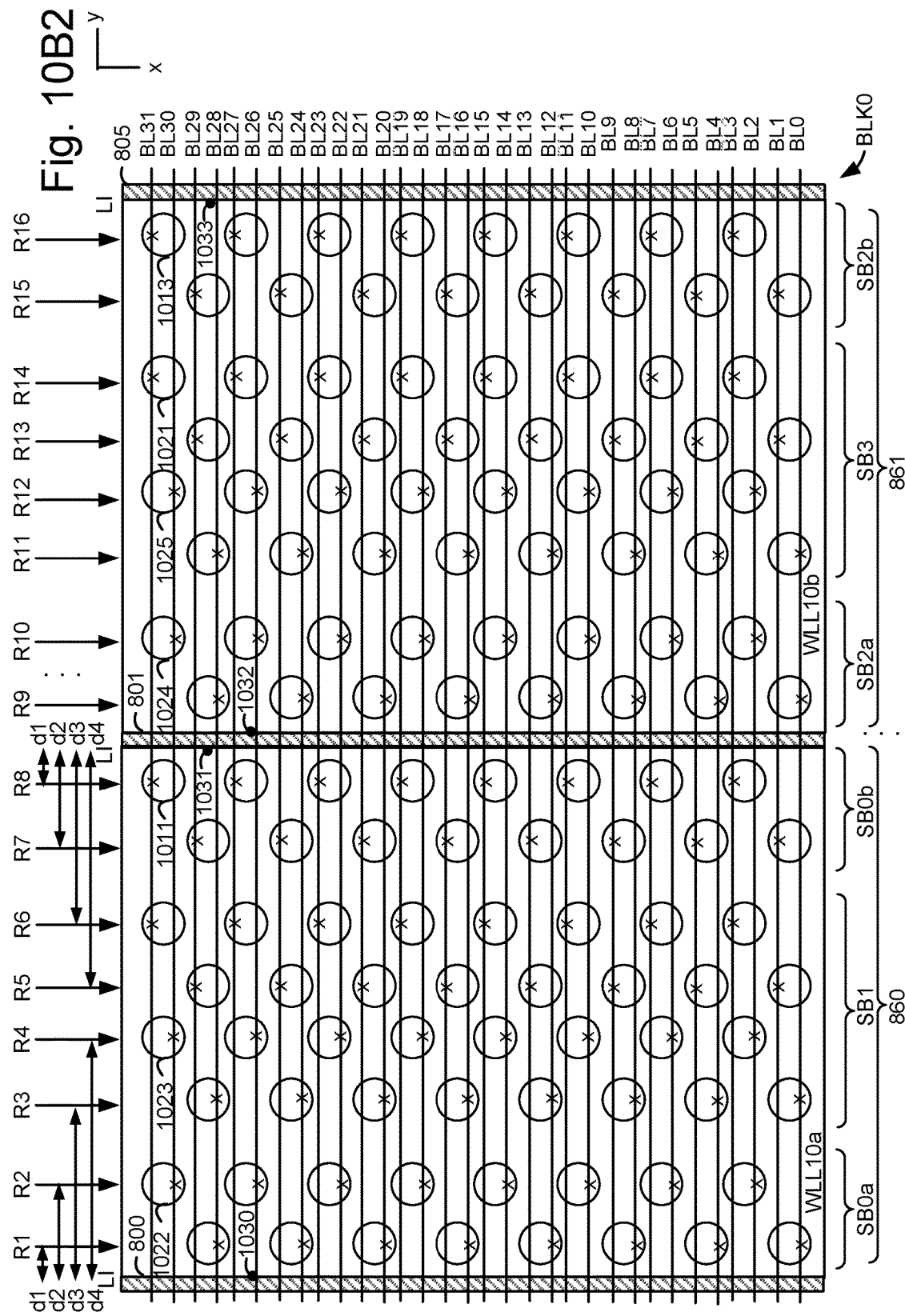

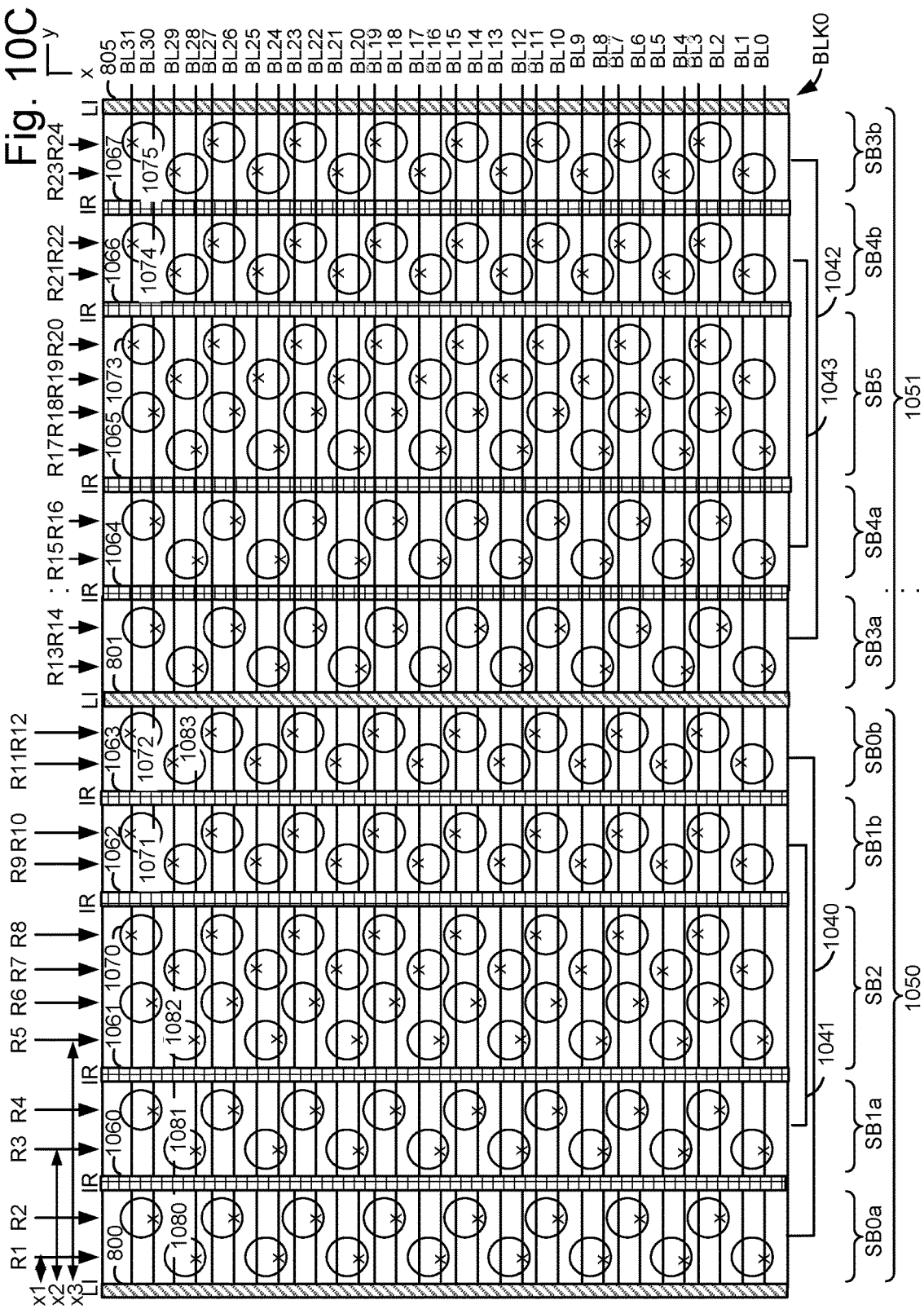

Fig. 11A
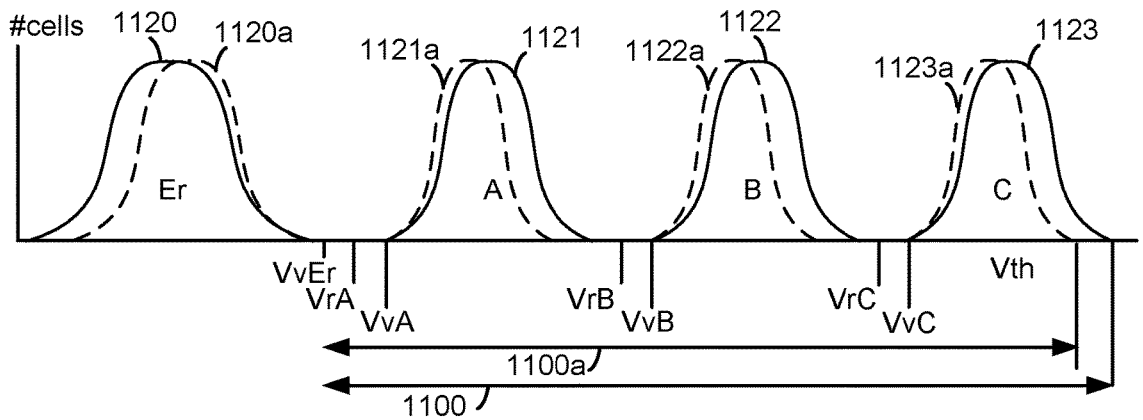
Fig. 11B
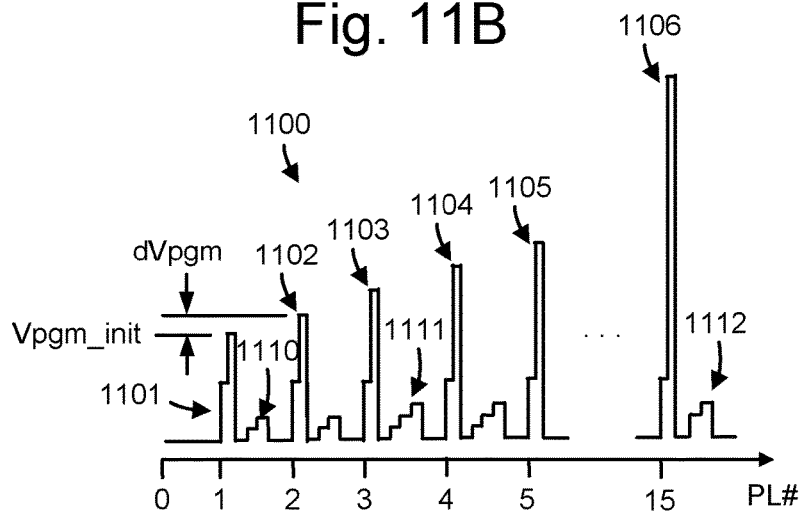
Fig. 11C
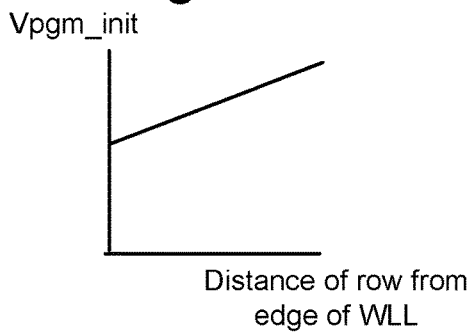
Fig. 11D
| Sub-block | Vpgm_init |
|---|---|
| SB0, SB2 | Vpgm_init_low |
| SB1, SB3 | Vpgm_init_high |
Fig. 11E
| Sub-block | Vpgm_init |
|---|---|
| SB0, SB3 | Vpgm_init_low |
| SB1, SB4 | Vpgm_init_medium |
| SB2, SB5 | Vpgm_init_high |

GROUPING MEMORY CELLS INTO SUB-BLOCKS FOR PROGRAM SPEED UNIFORMITY

CLAIM OF PRIORITY

This application is a divisional application of U.S. patent application Ser. No. 15/437,718, entitled "GROUPING MEMORY CELLS INTO SUB-BLOCKS FOR PROGRAM SPEED UNIFORMITY," by Zhang et al., filed Feb. 21, 2017 and issued as U.S. Pat. No. 9,959,932 on May 1, 2018, and incorporated herein by reference in its entirety.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

Like-numbered elements refer to common components in the different figures.

FIG. 4 depicts an example cross-sectional view of a portion of one of the blocks of FIG. 2 or 3.

FIG. 5 depicts an example transistor 500.

FIG. 8C depicts an example cross-sectional view of a block BLK0 of memory cells where word line layers are shared among one undivided sub-block and one divided sub-block in each of regions 860 and 861.

FIG. 9A depicts a perspective view of a set of blocks consistent with FIG. 8A.

FIG. 10A depicts an example top view of SGD layers of a block BLK0 consistent with FIGS. 8A and 9A, where word line layers are shared among two undivided sub-blocks in each of regions 850 and 851.

FIG. 10B1 depicts an example top view of SGD layers of a block BLK0 consistent with FIGS. 8C and 9B, where word line layers are shared among one undivided sub-block and one divided sub-block in each of regions 860 and 861.

FIG. 10B2 depicts an example top view of word line layers of a block BLK0 consistent with FIG. 10B1.

FIG. 10C depicts an example top view of SGD layers of a block BLK0, where word line layers are shared among one undivided sub-block and two divided sub-blocks in each of regions 1050 and 1051.

FIG. 11A depicts an example threshold voltage (Vth) distribution of a set of memory cells connected to a word line, showing the effects of programming speed variations in a block, where four data states are used.

FIG. 11B depicts a waveform of an example programming operation comprising incremental step pulse programming, where Vpgm_init is an initial program voltage and dVpgm is a step size.

FIG. 11C depicts a plot of Vpgm_init for memory cells versus a distance of the row in which the memory cells are located from an edge of a WLL.

FIG. 11D depicts an example table which associates an optimum value of Vpgm_init with each sub-block of FIG. 10B1.

FIG. 11E depicts an example table which associates an optimum value of Vpgm_init with each sub-block of FIG. 10C.

DETAILED DESCRIPTION

Figure 1:
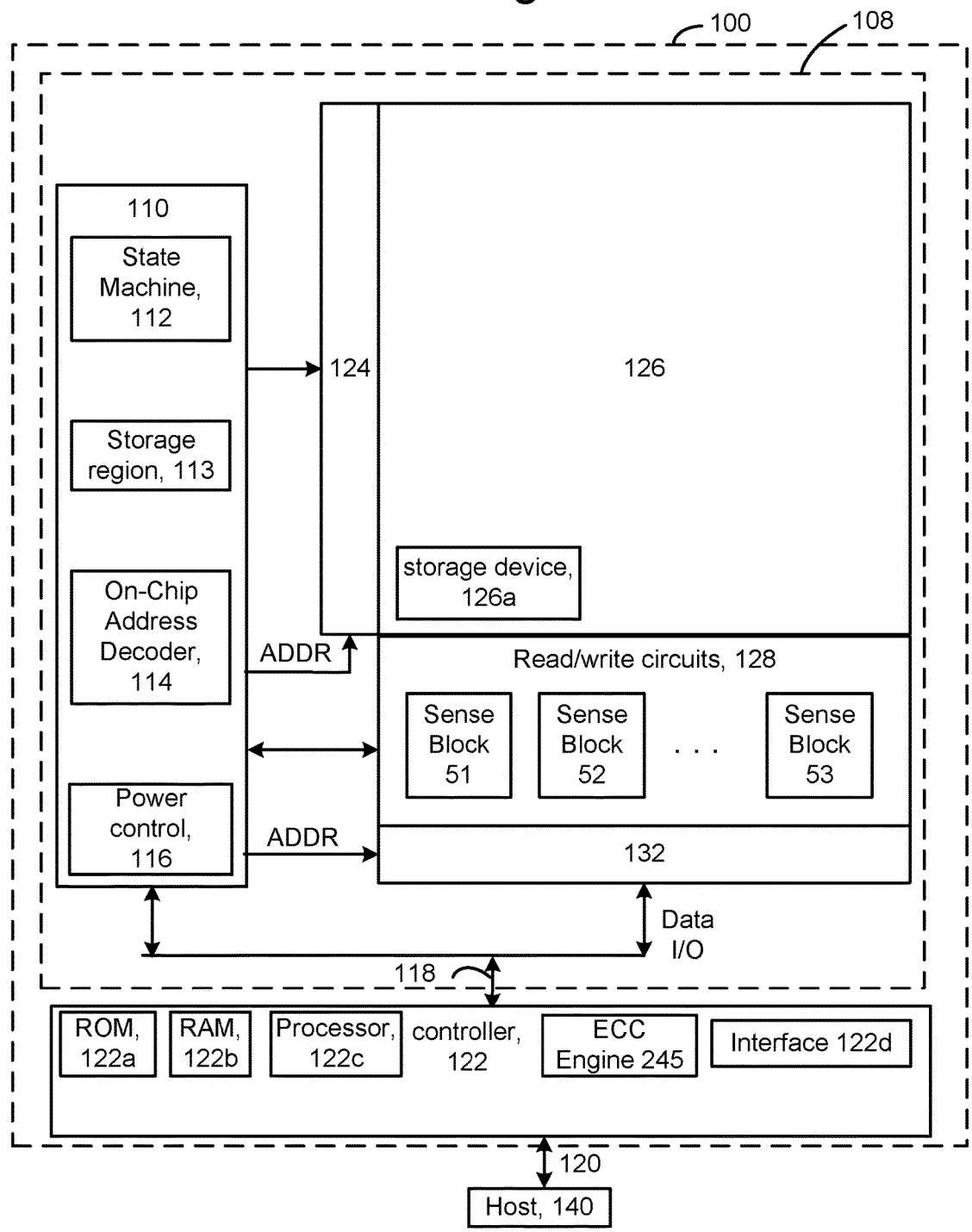
FIG. 1 is a block diagram of an example memory device.

Techniques are provided for programming memory cells in a memory device such as a 3D stacked non-volatile memory device with improved program speed uniformity. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory strings extend in memory holes which are formed in the stack.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 11A). In a three-bit per cell memory device, there are eight data states including the erased state and seven higher data states referred to as the A, B, C, D, E, F and G data states. In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, the programming speed can vary for memory cells of different memory holes based on their distance from the closest local interconnect which is used to introduce an etchant to remove the sacrificial material of the word lines before depositing the metal of the word lines. In particular, in addition to removing the sacrificial material, the etchant removes some of the blocking oxide layer 667 (FIG. 6) of the memory cells. Moreover, the blocking oxide layers which are closest to the interconnect receive the most etching and become the thinnest. A thinner blocking oxide layer results in a faster program or erase speed because the gate-to-channel distance decreases. With a given gate-to-channel voltage such as in a programming operation, the electric field strength is larger when the distance is smaller. Thus, the thickness Th (FIG. 6) of the blocking oxide layers, which may comprise SiO2, varies for memory holes based on their distance from the interconnect. This results in reduced performance as seen by increased programming time, Vth distribution widths and program disturb. In particular, a higher final program voltage and more program loops may be needed to finish the programming operation for the slower cells which are further from the interconnect.

Techniques provided herein address the above and other issues. In one aspect, a memory device is provided in which the memory strings which have a relatively thin blocking oxide layer are programmed separately from memory strings which have a relatively thick blocking oxide layer. For example, SGD transistors for the memory strings which have a relatively thick blocking oxide layer can be connected to one another in one undivided sub-block while, separately, SGD transistors for the memory strings which have a relatively thin blocking oxide layer can be connected to one another in another sub-block which is divided into two portions. The one sub-block may be between the two portions and centrally located between adjacent local interconnects. Moreover, in one approach, the programming for the memory strings which have a relatively thick blocking oxide layer can use a larger initial program voltage compared to the memory strings which have a relatively thin blocking oxide layer. A programming parameter such as Vpgm_init can be optimized for sets of cells which have common programming speed. The techniques result in an overall reduced programming duration, a narrower Vth distribution, reduced program disturb and better reliability.

The techniques are expected to become more important as memory devices are further scaled down. To perform the scale down, the number of local interconnects is reduced and the number of memory holes between local interconnects is increased. This means larger areas of sacrificial material need to be etched away and replaced (e.g., by tungsten) between every two neighboring local interconnects. The duration of the etching process will therefore increase, resulting in a large difference in block oxide thickness for the different memory holes based on their distance from the closest local interconnect.

These and other features are discussed herein.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain-end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
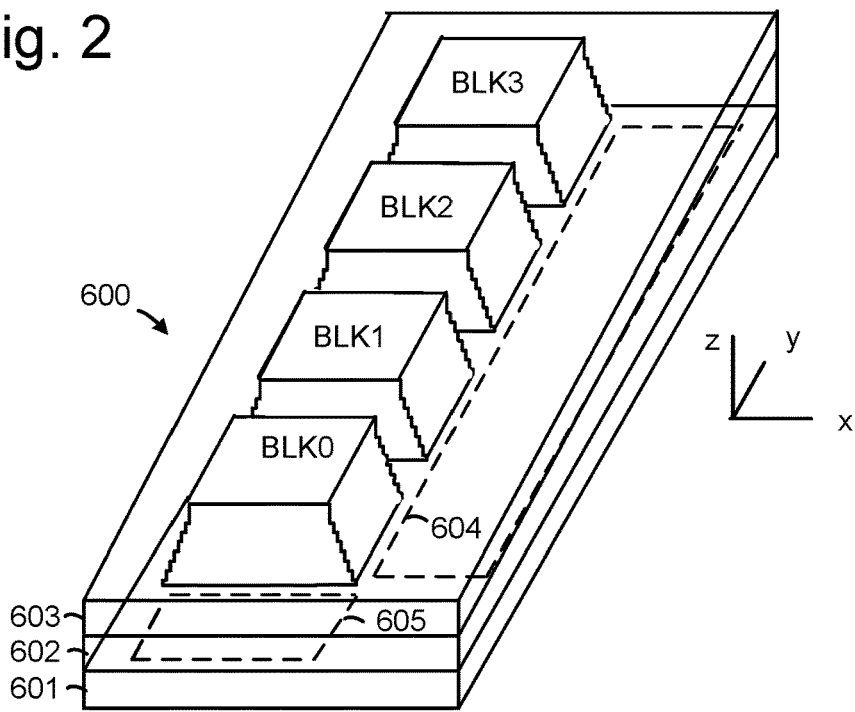
FIG. 2 is a perspective view of a memory device 600 comprising a set of blocks in a plane in an example 3D configuration of the memory structure 126 of FIG. 1.

FIG. 2 is a perspective view of a memory device 600 comprising a set of blocks in a plane in an example 3D configuration of the memory structure 126 of FIG. 1. On the substrate 601 are example blocks BLK0, BLK1, BLK2 and BLK3 of memory cells (storage elements) and peripheral areas with circuitry for use by the blocks. The peripheral area 604 runs along an edge of each block while the peripheral area 605 is at an end of the set of blocks. Voltage detectors for bit lines may be located in this peripheral area 605, in one approach. In this case, the blocks BLK0, BLK1, BLK2 and BLK3 are at progressively further distances from the voltage detectors.

The circuitry can include voltage drivers which can be connected to control gate layers, bit lines and source lines of the blocks. In one approach, control gate layers at a common height in the blocks are commonly driven. The substrate can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions. Typically, the length of the blocks is much longer in the x-direction than the width in the y-direction.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes, as depicted in FIG. 3.

Figure 3:
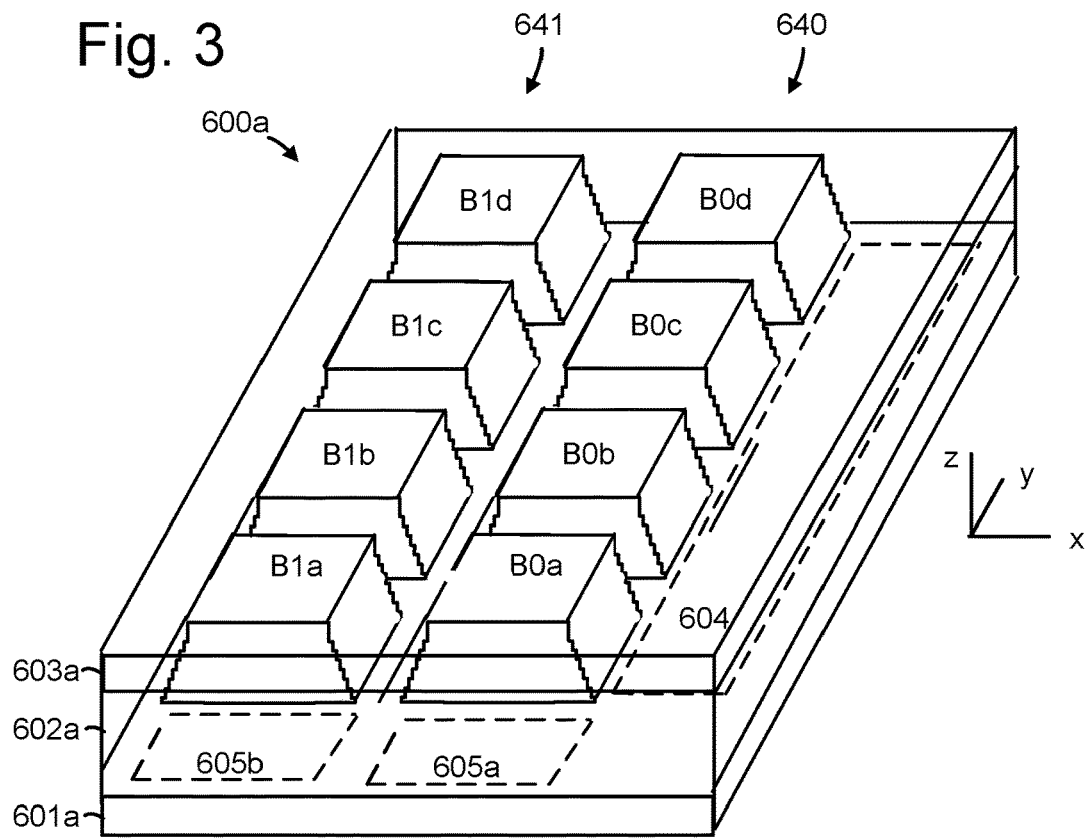
FIG. 3 is a perspective view of a memory device 600a comprising sets of blocks in two planes in another example 3D configuration of the memory device of FIG. 1.

FIG. 3 is a perspective view of a memory device 600a comprising sets of blocks in two planes in another example 3D configuration of the memory device of FIG. 1. Sets of blocks 640 and 641 are formed on two planes on a substrate 601a. A plane is typically defined as a region of a substrate which includes a number of blocks of memory cells and associated row and column control circuitry. The blocks of a plane may be formed on a common p-well, in one approach. The blocks are formed in an intermediate region 602a of the memory device. The set of blocks 640 includes blocks B0a, B0b, B0c and B0d. The set 641 includes blocks B1a, B1b, B1c and B1d. A peripheral area 604a of the substrate includes circuitry for use by both sets of blocks. Peripheral areas 605a and 605b can include circuitry for use by the sets of blocks 640 and 641, respectively.

FIG. 4 depicts an example cross-sectional view of a portion of one of the blocks of FIG. 2 or 3. The block comprises a stack 610 of alternating conductive and dielectric layers. The block comprises conductive layers spaced apart vertically, and the conductive layers comprise word lines connected to the memory cells and select gate lines connected to SGD and SGS transistors.

In this example, the conductive layers or plates comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 or the plurality of word line layers and a drain-end 615 at a top 616a of the stack or the plurality of word line layers. Local interconnects, such as interconnect 617, may be provided periodically across the stack. The local interconnects may be metal-filled slits which extend through the stack, such as to connect the source line/substrate to a line above the stack. The metal 617d is isolated from the word line layers by an insulating material 617c. The slits may be used during the formation of the word lines and subsequently filled with metal. Specifically, a stack may be formed with a sacrificial material such as SiN for the word lines layers alternating with dielectric layers such as oxide. Slits are etched periodically in the stack down to the substrate, thereby exposing portions of the sacrificial material. An etchant such as hot phosphoric acid is deposited in the slits to remove the sacrificial material, forming voids. A metal is then deposited in the voids via the slits, thus forming the final word line layers. Subsequently, the metal in the slits is cleaned away and the insulating material 617c is deposited along the sidewalls of the slits. A hole is etched in the bottom of the insulation layer. The remainder of the slits is filled with the metal 617d which extends through the hole to the substrate and up to the top of the stack, thus forming a conductive path or local interconnect from the bottom to the top of the stack A portion of a bit line BL0 is also depicted. A conductive via connects the drain-end of each memory string to a bit line. For example, a conductive via 621 connects the drain-end 615 to BL0. The local interconnect 617 has a top 617a and a bottom 617b. The bottom is in contact with the substrate.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

This example includes two SGD transistors, two drain side dummy memory cells, two source side dummy memory cells and two SGS transistors in each string, as an example. Generally, the use of dummy memory cells is optional and one or more may be provided. Also, one or more SGD transistors and one or more SGS transistors may be provided in a memory string.

Figure 8B:
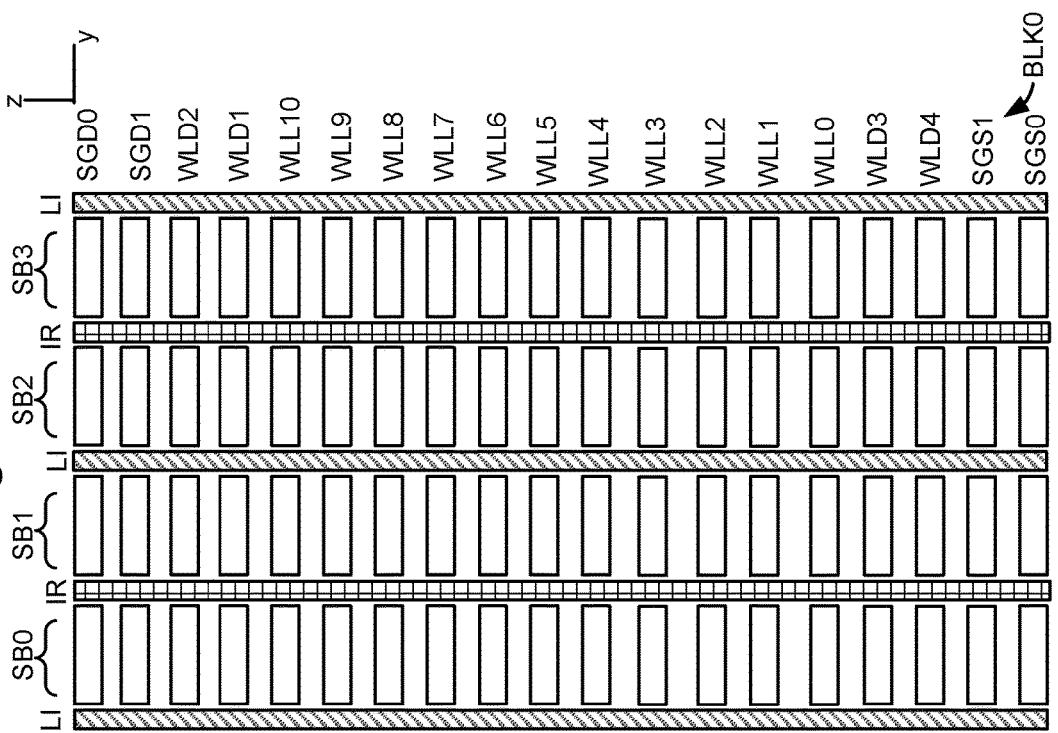
FIG. 8B depicts an example cross-sectional view of a block BLK0 of memory cells where separate word line layers are provided for each of four undivided sub-blocks.

An isolation region IR may be provided to separate portions of the SGD layers from one another to provide one independently driven SGD line per sub-block. In one example, the word line layers are common to two adjacent sub-blocks. See FIG. 8A. In another possible implementation, the isolation region extends down to the substrate to separate the word line layers. See FIG. 8B. In this case, the word line layers are separate in each sub-block. Although, in either case, the word line layers of a block can be joined at their ends to one another so that they are commonly driven within a block, as depicted in FIGS. 9A and 9B. The isolation region comprises an insulating material such as oxide and separates sets of word line layers in a stack.

FIG. 5 depicts an example transistor 500. The transistor comprises a control gate CG, a drain D, a source S and a channel CH. During a programming operation, the transistor has a positive gate-to-channel voltage. During an erase operation, the transistor has a positive channel-to-gate voltage.

Figure 6:
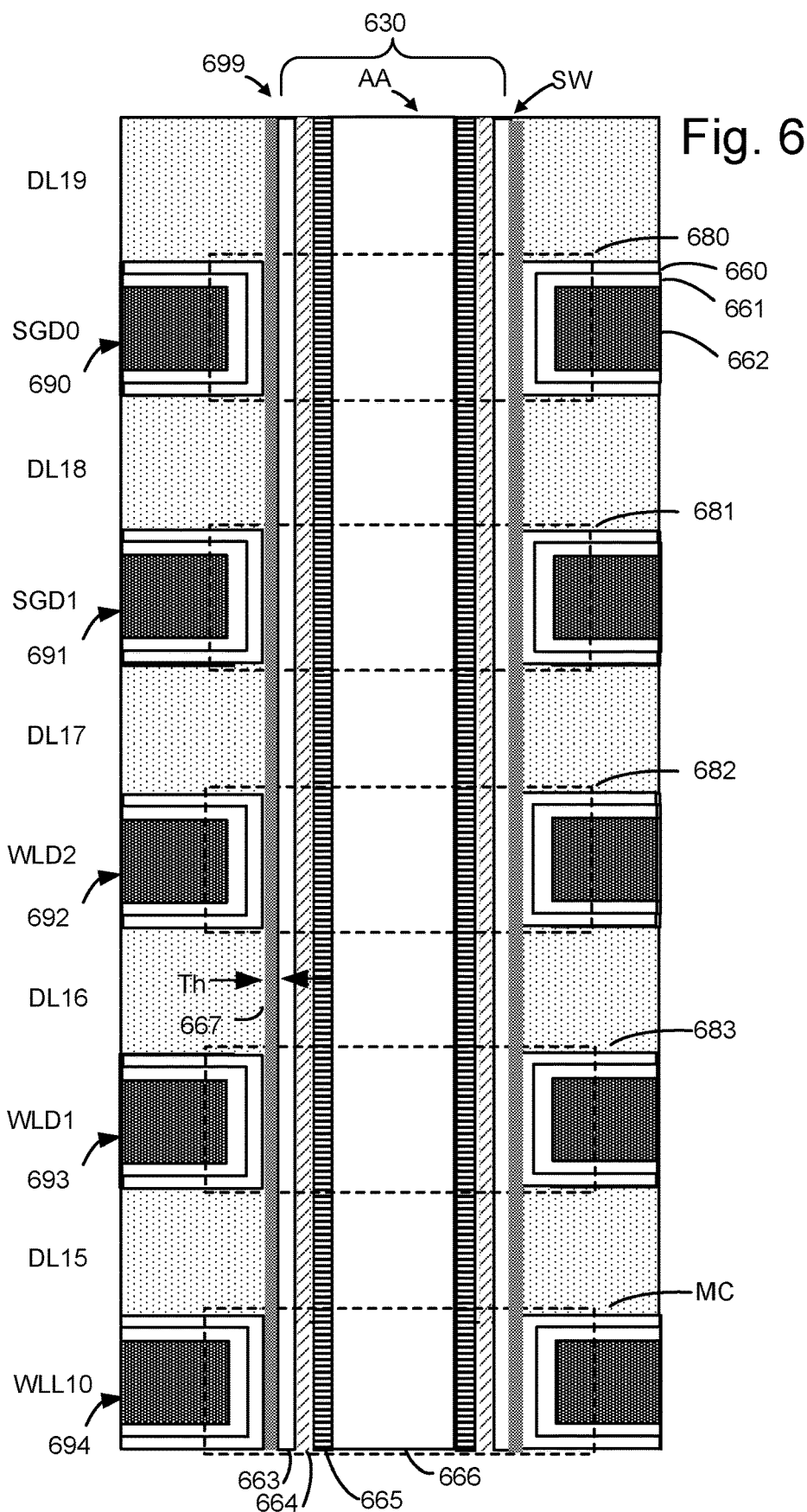
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a blocking oxide 667, a charge-trapping layer 663 or film such as silicon nitride ($Si_3N_4$) or other nitride, a tunneling layer 664, a channel 665 (e.g., comprising polysilicon), and a dielectric core 666. A word line layer can include a block high-k material 660, a metal barrier 661, and a conductive metal 662 such as Tungsten as a control gate. For example, control gates 690, 691, 692, 693 and 694 are provided. Additional pillars are similarly formed in the different memory holes. A pillar can form a columnar active area (AA) of a NAND string.

The blocking oxide layer 667 has a thickness Th. As mentioned, this thickness can vary for different memory holes based on their distance from the closest local interconnect which is used to introduce an etchant to remove the sacrificial material of the word lines. In particular, the sacrificial material surrounding the outer or edge memory holes (memory holes which are closer to the local interconnect or the edge of the word line layers) will be etched earlier by the etchant which is introduced via vertically etched-through slits, while the sacrificial material surrounding the inner or interior memory holes (memory holes which are further from the local interconnect or the edge of the word line layers) will be etched later. The blocking oxide layer or other dielectric layer in the edge memory holes will be exposed to the etchant for longer time. Due to this exposure, the blocking oxide layer inside the edge memory holes will be etched away more than in the interior memory holes. This results in different programming speeds, as mentioned. If the edge and the interior memory holes are grouped together inside the same sub-block, then when a selected word line in the sub-block is programmed, the program speed difference between fast and slow cells will be large. This program speed difference within the same word line will require more program verify tests during the program process and therefore increase the total programming time.

Techniques provided herein overcome this problem by grouping cells with a common programming speed. For example, edge cells can be in one group while interior cells are in another group.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

In the example of FIG. 6, the SGD transistors are formed at the same time as the memory cells and share the memory films. In another possible approach, the SGD transistors are formed after the memory cells are formed and do not include the memory films. In this case, the SGD transistors may be doped to provide a desired Vth level without the use of memory films. In one embodiment, the memory holes are formed and filled in, after which the SGD layers are deposited and etched through to form a conductive path to a top of the memory hole.

Figure 7:
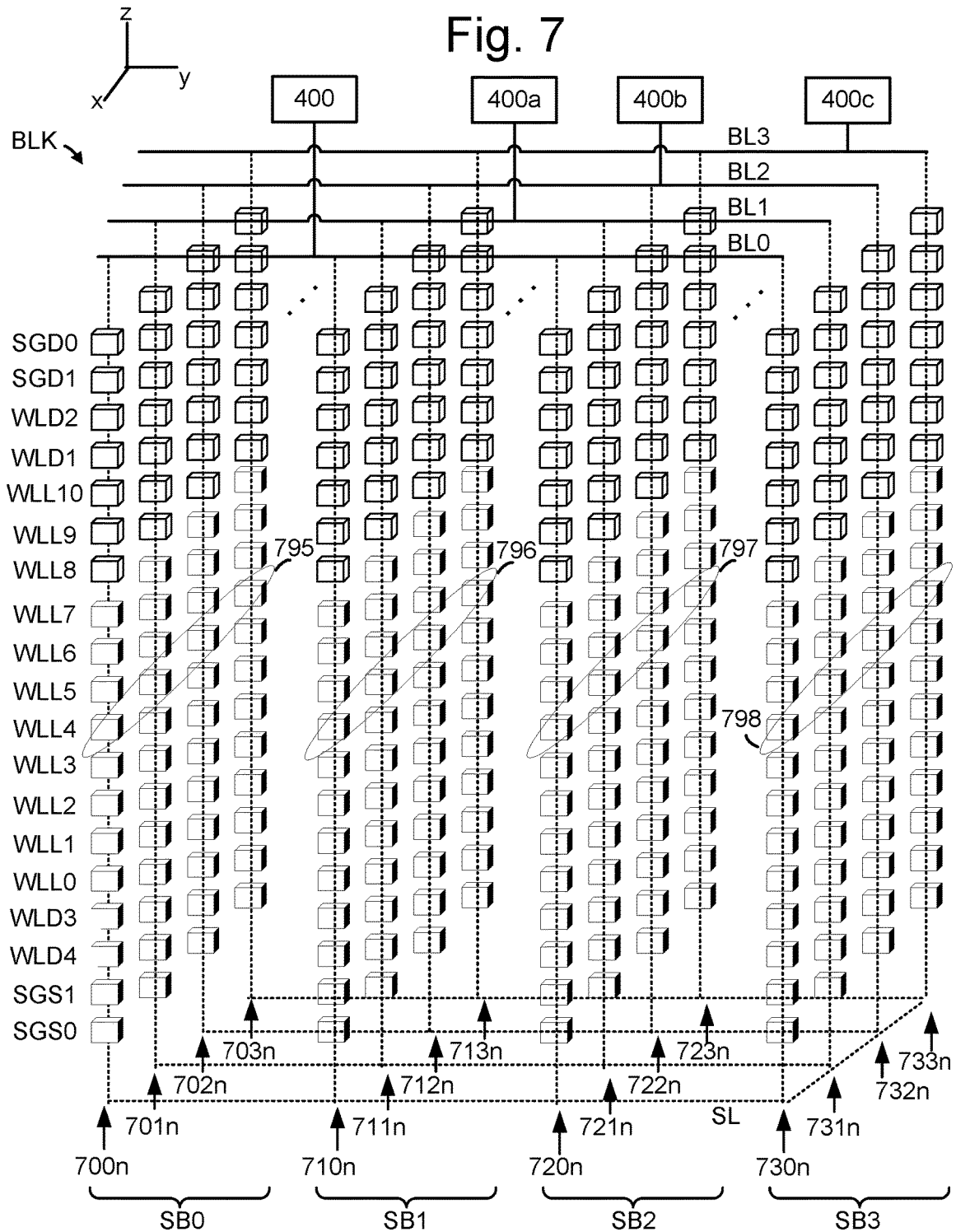
FIG. 7 depicts example sub-blocks SB0-SB3 in one of the blocks of FIG. 2 or 3.

FIG. 7 depicts example sub-blocks SB0-SB3 in one of the blocks of FIG. 2 or 3. A sub-block is a portion of a block and represents a set of memory strings which are programmed together and which have a common SGD line. Also, each memory string in a sub-block is connected to a different bit line, in one approach.

Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. A sense circuit may be connected to each bit line. For example, sense circuits 400, 400a, 400b and 400c are connected to bit lines BL0, BL1, BL2 and BL3, respectively. The NAND strings are examples of vertical memory strings which extend upward from a substrate.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 are connected to WLL4.

Figure 8A:
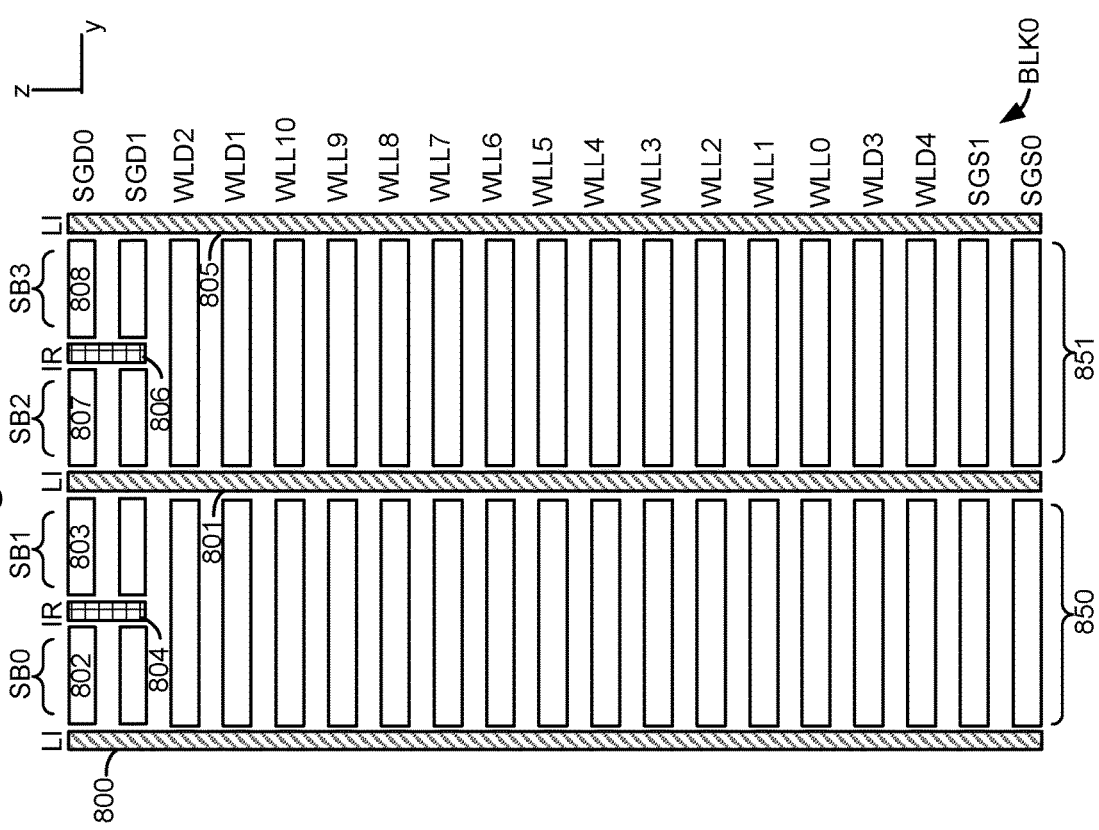
FIG. 8A depicts an example cross-sectional view of a block BLK0 of memory cells where word line layers are shared among two undivided sub-blocks.
Figure 9B:
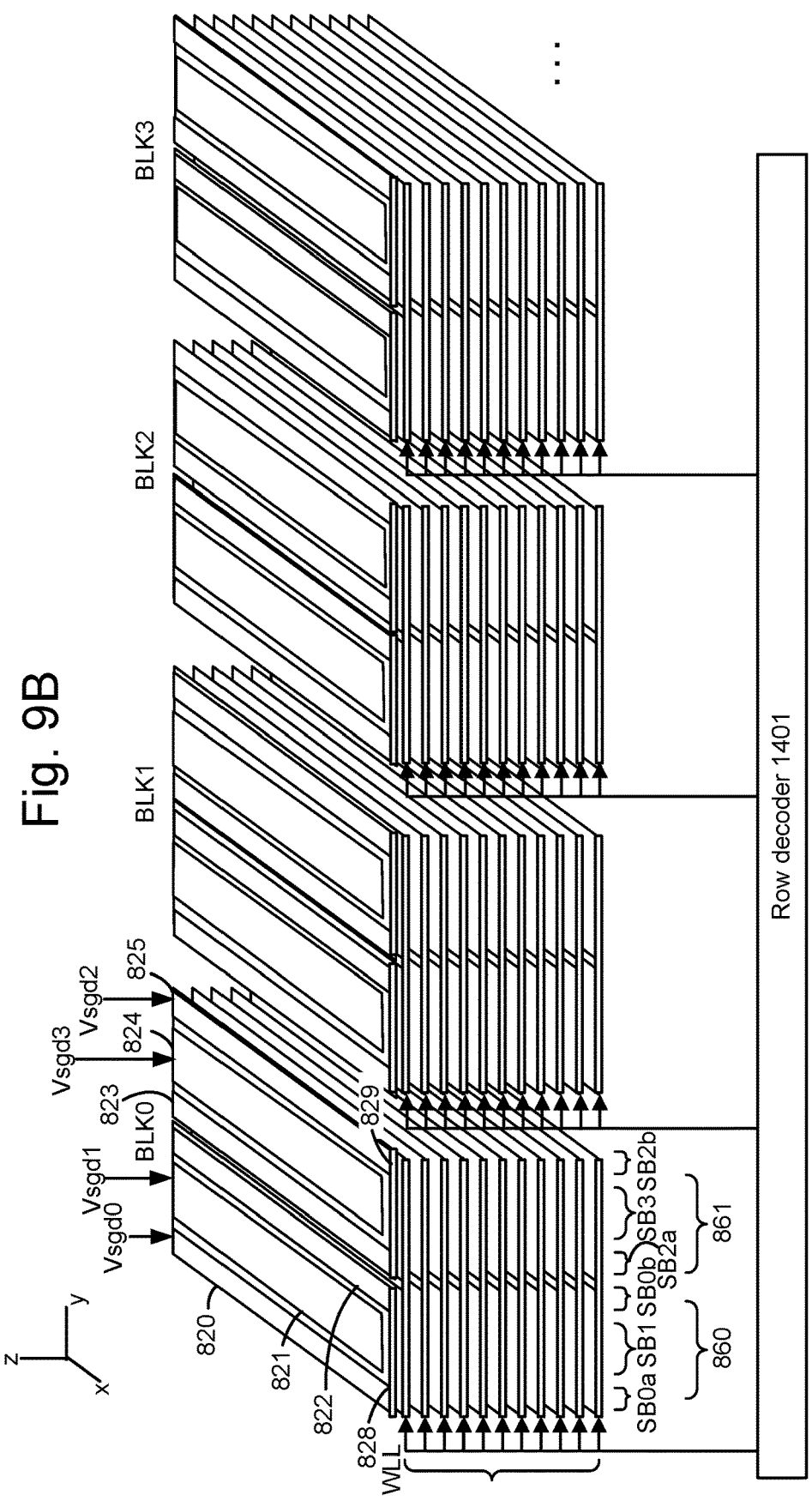
FIG. 9B depicts a perspective view of a set of blocks consistent with FIG. 8C.

FIG. 8A depicts an example cross-sectional view of a block BLK0 of memory cells where word line layers are shared among two undivided sub-blocks. Region 850 of the stack comprises a plurality of word lines layers spaced apart vertically, and is between local interconnects (LI) 800 and 801. This region includes sub-blocks SB0 and SB1. These sub-blocks each have a separate SGD layer 802 and 803 separated by an isolation region (IR) 804. Similarly, region 851 of the stack comprises a plurality of word lines layers spaced apart vertically, and is between local interconnects (LI) 801 and 805. This region includes sub-blocks SB2 and SB3. These sub-blocks each have a separate SGD layer 807 and 808 separated by an IR 806.

One set of word line layers is shared among SB0 and SB1, and another set of word line layers is shared among SB2 and SB3. The local interconnects are provided on both sides of the block and in the middle of the block, between SB1 and SB2, in this example. The isolation regions, discussed in connection with FIG. 4, provide separate SGD layers for each sub-block. The widths of the word line layers are uniform within each region 850 and 851, in this example. Further, the widths of the word line layers in region 850 may be the same as in region 851.

Generally, a block can comprise one or more regions of word line layers between two or more local interconnects. Note that a metal interconnect can be replaced by an isolation region (e.g., insulation such as oxide with no metal) if it is not desired to have a conductive path through the stack.

FIG. 8B depicts an example cross-sectional view of a block BLK0 of memory cells where separate word line layers are provided for each of four undivided sub-blocks. Here, the IR extends down through the stack so that the word line layers are separated in each sub-block. Although, in FIGS. 8A and 8B, the word line layers may be joined at an end region so they can be commonly driven in a block. See FIG. 9A. The widths are uniform within each sub-block for all of the word line layers, in this example.

FIG. 8C depicts an example cross-sectional view of a block BLK0 of memory cells where word line layers are shared among one undivided sub-block and one divided sub-block in each of regions 860 and 861. Region 860 of the stack is between local interconnects 800 and 801 and includes one divided sub-block comprising sub-block portions SB0a and SB0b which are separated by another sub-block SB1. Generally, a divided sub-block can include two portions which are separated by at least one other sub-block or sub-block portion. The edge sub-block portions SB0*a* and SB0*b* each have a respective edge SGD layer 820 and 822, but these layers are connected by a conductive path so that they are commonly driven. See conductive path 828 in FIG. 9B. The undivided sub-block SB1 has an SGD layer 821 which is driven separately from the SGD layers 820 and 822. The SGD layer 821 is separated from the SGD layers 820 and 822 by isolation regions 830 and 831, respectively. The widths of the SGD layers may be equal in sub-block regions SB0*a* and SB0*b* and smaller than a width of the SGD layer 821 in SB1, where the width is in the y-direction in which the bit lines extend.

Thus, the edge select gate layers 820 and 822 are connected to one another and separate from the interior select gate layer 821. The edge select gate layers 823 and 825 are connected to one another and separate from the interior select gate layer 824.

Also, the edge select gate layers are connected to memory strings (e.g., 1022 and 1011, respectively) of the first and second edge portions (e.g., SB0*a* and SB0*b*, respectively), and the interior select gate layer 821 is between the edge select gate layers 820 and 822 and is connected to memory strings (e.g., 1020, 1023) of the interior sub-block (e.g., SB1).

Similarly, region 861 of the stack is between local interconnects 801 and 805 and includes one divided sub-block comprising sub-block portions SB2*a* and SB2*b* which are separated by another sub-block SB3. The edge sub-block portions SB2*a* and SB2*b* each have a respective edge SGD layer 823 and 825 but these layers are connected by a conductive path so that they are commonly driven. See conductive path 829 in FIG. 9B. The sub-block SB3 has an SGD layer 824 which is driven separately from the SGD layers 823 and 825. The SGD layer 824 is separated from the SGD layers 823 and 825 by isolation regions 833 and 834, respectively. The widths of the SGD layers may be equal in sub-block regions SB2*a* and SB2*b* and smaller than a width of the SGD layer 824 in SB3.

As mentioned, the techniques provided herein group cells with a common programming speed. For example, edge cells can be in one group (which is divided into two portions) while interior cells are in another, undivided group. Compared to the example of FIG. 8A, where such grouping does not occur, there is an additional etch of the SGD layers to create the groups. However, the number of bit lines and memory holes or strings can remain the same. Also, the number of memory holes or strings in a sub-block can remain the same. There is also a modification of the connections between the bit lines and memory strings. For example, compare FIGS. 10A and 10B. These are minor adjustments which significantly improve performance.

FIG. 9A depicts a perspective view of a set of blocks consistent with FIG. 8A. Blocks BLK0, BLK1, BLK2 and BLK2 are depicted. The regions 850 and 851 as discussed in connection with FIG. 8A are depicted. The word line layers (WLL) in each block are depicted along with example SGD lines. One SGD line or layer is provided in each sub-block in this example. BLK0 includes sub-blocks SB0, SB1, SB2 and SB3. The sub-blocks are elongated in the x direction and contain thousands of memory strings in practice. Additionally, many more blocks beyond those depicted are arranged in a row on the substrate in the y-direction. The word line layers and SGD/SGS layers may receive voltages from a row decoder 1401. See also FIG. 14. Each SGD layer can receive a separate voltage from the row decoder. For example, SGD layers 802, 803, 807 and 808 may receive voltages Vsgd0, Vsgd1, Vsgd2 and Vsgd3, respectively. During programming of a block, the memory cells of one word line layer and one sub-block are programmed at a time. Thus, memory cells of WLL0 in SB0 are programmed, followed by memory cells of WLL1 in SB0 and so forth until memory cells of all word line layers in SB0 are programmed. Next, memory cells of WLL0 in SB2, followed by memory cells of WLL1 in SB2 and so forth. The programming can then proceed to the next sub-block if necessary.

FIG. 9B depicts a perspective view of a set of blocks consistent with FIG. 8C. The regions 860 and 861 as discussed in connection with FIG. 8B are depicted. The WLL in each block are depicted along with example SGD lines. SGD lines or layers 820 and 822 are provided for sub-block portions SB0*a* and SB0*b*, respectively, and are connected by a conductive path 828 so they can be commonly driven by a voltage Vsgd0.

SGD lines or layers 823 and 825 are provided for sub-block portions SB2*a* and SB2*b*, respectively, and are connected by a conductive path 829 so they can be commonly driven by a voltage Vsgd2. SGD layers 821 and 824 are provided for sub-blocks SB1 and SB3, respectively, and are separately driven by voltages Vsgd1 and Vsgd3, respectively.

Figure 10B1:
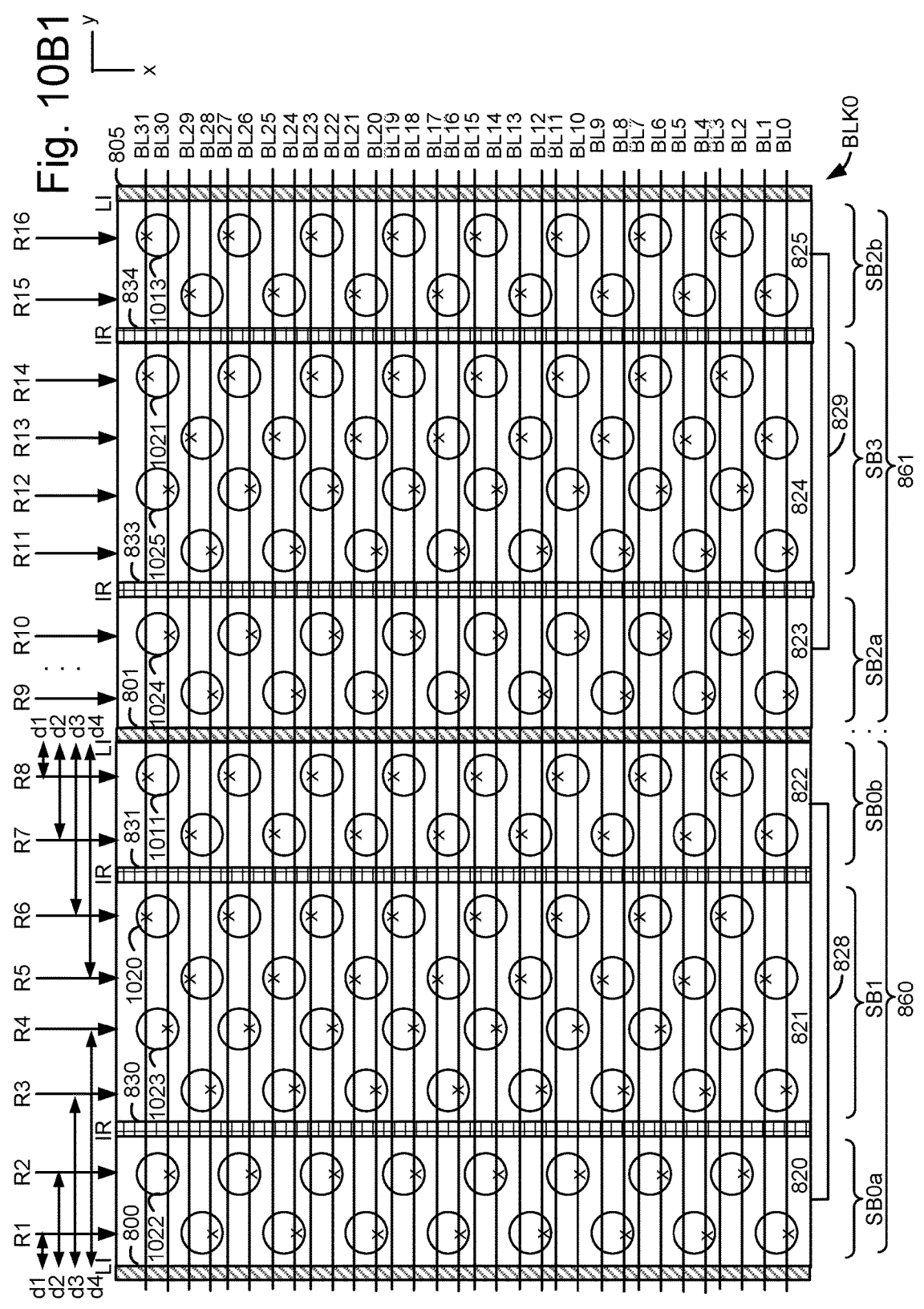

In FIG. 10A-10C, each circle represents the cross-section of a memory hole at a select gate layer. Or, the memory hole does not extend up to the SGD layers, each circle represents the cross-section of a memory hole at a word line layer which is below the select gate layer. A number of bit lines extend above the memory holes and are connected to the memory holes as indicated by the "X" symbols. In these examples, there are 31 bit lines labelled as BL0-BL31. Each bit line is connected to one memory hole or string in each sub-block.

FIG. 10A depicts an example top view of SGD layers of a block BLK0 consistent with FIGS. 8A and 9A, where word line layers are shared among two undivided sub-blocks blocks in each of regions 850 and 851. The SGD layers 802, 803, 807 and 808 of FIG. 8A are depicted. SB0 in region 850 extends between the local interconnect 800 and the isolation region 804. SB1 in region 850 extends between the isolation region 804 and the local interconnect 801. SB2 in region 851 extends between the local interconnect 801 and the isolation region 806. SB3 in region 851 extends between the isolation region 806 and the local interconnect 805.

As mentioned, each bit line is connected to one memory hole or string in each sub-block. For example, BL31 is connected to memory holes or strings 1010, 1011, 1012 and 1013 in SB0, SB1, SB2 and SB3, respectively. Also, the memory strings are arranged in rows R1-R16 which extend in the x-direction, and adjacent rows are staggered to improve the memory hole density.

The distance of each row of memory strings from the closest local interconnect is depicted. For example, R1, R2, R3 and R4 are at distances of d1, d2, d3 and d4, respectively, from the LI 800 and R5, R6, R7 and R8 are at distances of d4, d3, d3 and d1, respectively, from the LI 801. The blocking oxide layers of the memory strings of each row are progressively thicker as the distance from the closest local interconnect is progressively larger.

FIG. 10B1 depicts an example top view of SGD layers of a block BLK0 consistent with FIGS. 8C and 9B, where word line layers are shared among one undivided sub-block and one divided sub-block in each of regions 860 and 861. The SGD layers 820-825 of FIG. 8C are depicted. Region 860 comprises a first edge portion SB0*a* of a divided sub-block SB0 between the local interconnect 800 and the isolation region 830, an interior undivided sub-block SB1 between the isolation regions 830 and 831, and an second edge portion SB0b of the sub-block SB0 between the isolation region 831 and the local interconnect 801. Region 861 comprises a first edge portion SB2a of a divided sub-block SB2 between the local interconnect 801 and the isolation region 833, an interior undivided sub-block SB3 between the isolation regions 833 and 834, and a second edge portion SB2b of the sub-block SB2 between the isolation region 834 and the local interconnect 805.

As mentioned, each bit line is connected to one memory hole or string in each subset. For example, BL31 is connected to memory holes or strings 1020, 1011, 1021 and 1013 in SB1, SB0b, SB3 and SB2b, respectively. As another example, BL30 is connected to memory holes or strings 1022, 1023, 1024 and 1025 in SB0a, SB1, SB2a and SB3, respectively. Generally, within the region 860, a first set of bit lines (e.g., the even-numbered bit lines of BL0-BL30) is connected to memory strings (e.g., 1022) of the first edge portion SB0a of the sub-block SB0 and to memory strings (e.g., 1023) of the interior sub-block SB1 but not to memory strings (e.g., 1011) of the second edge portion SB0b of the sub-block, and a second set of bit lines (e.g., the odd-numbered bit lines of BL0-BL30) is connected to memory strings (e.g., 1011) of the second edge portion SB0b and to memory strings (e.g., 1020) of the interior sub-block SB1 but not to memory strings (e.g., 1022) of the first edge portion SB0a. Thus, a bit line is connected to only one memory string in a sub-block in each block, whether the sub-block is divided or undivided, in one approach. This ensures that each memory string in a sub-block can be programmed or inhibited during a program voltage by applying a low or high bit line voltage, respectively. That is, all memory strings in a sub-block can be programmed concurrently.

The distance of each row of memory strings from the closest local interconnect is depicted. For example, R1, R2, R3 and R4 are at distances of d1, d2, d3 and d4, respectively, from the LI 800 and R5, R6, R7 and R8 are at distances of d4, d3, d3 and d1, respectively, from the LI 801. The blocking oxide layers of the memory strings of each row are progressively thicker as the distance from the closest local interconnect is progressively larger. As a result, the thickness of the blocking oxide layers is similar (relatively thin) for R1 and R2 in SB0a, R7 and R8 in SB0b, R9 and R10 in SB2a and R15 and R16 in SB2b. The thickness of the blocking oxide layer is similar (relatively thick) for R3-R6 in SB1, and for R11-R14 in SB3.

In one embodiment, in the region 860, the memory strings are arranged in rows R1-R8, and a number of rows in the first and second edge portions together (e.g., four rows: R1 and R2 in first edge portion SB0a and R7 and R8 in second edge portion SB0b) is equal to a number of rows in the interior sub-block (e.g., four rows, R3-R6 in SB1).

In another embodiment, in FIG. 10C, in the region 1050, the memory strings are arranged in rows R1-R12, and a number of rows in the first and second edge portions together (e.g., four rows: R1 and R2 in first edge portion SB0a and R11 and R12 in second edge portion SB0b) is less than a number of remaining rows in the block (e.g., eight rows, R3-R10, including R3 and R4 in SB1a, R5-R8 in SB2 and R9 and R10 in SB1b).

Generally, the number of rows in a sub-block or sub-block portion can be set based on testing which indicates the relative programming speed of the memory cells based on distance from the edge of the word line layers. In one approach, there is a center sub-block and one or more sub-block portions on each side of the center sub-block.

FIG. 10B2 depicts an example top view of word line layers of a block BLK0 consistent with FIG. 10B1. The word line layers could be any of WLL0-WLL10 in FIG. 4, for instance. Here, the word line layer WLL10 is depicted in portions WLL10a and WLL10b. A first plurality of word line layers spaced apart vertically comprises WLL0a-WLL10a (WLL0a-WLL9a are not shown here but are below WLL10a), and a second plurality of word line layers spaced apart vertically comprises WLL0b-WLL10b (WLL0b-WLL9b are not shown here but are below WLL10b).

As mentioned, the region between LIs comprises a plurality of word line layers which are vertically spaced apart from one another by dielectric layers. Each word line layer comprises an edge which is adjacent to an LI. For example, WLL10a comprises edges 1030 and 1031 adjacent to LIs 800 and 801, respectively, and WLL10b comprises edges 1032 and 1033 adjacent to LIs 801 and 805, respectively.

The distance of each row of memory strings from the closest edge of the word line layer is depicted. This is also the distance to the closest local interconnect. For example, R1, R2, R3 and R4 are at distances of d1, d2, d3 and d4, respectively, from the edge 1030 and R5, R6, R7 and R8 are at distances of d4, d3, d3 and d1, respectively, from the edge 1031. The blocking oxide layers of the memory strings of each row are progressively thicker as the distance from the closest edge is progressively larger.

In one embodiment, the plurality of word line layers WLL0a-WLL10a have opposing first and second edges (1030 and 1031, respectively), and memory strings of the first and second edge portions (e.g., 1022 and 1011, respectively), of SB0a and SB0b) are adjacent to the first and second edges, respectively. Similarly, the plurality of word line layers WLL0b-WLL10b have opposing first and second edges (1032 and 1033, respectively), and memory strings of the first and second edge portions (e.g., 1024 and 1013, respectively, of SB2a and SB2b) are adjacent to the first and second edges, respectively.

First and second isolation areas (e.g., 800 and 801) or interconnects are adjacent to the first and second edges (e.g., 1030 and 1031), respectively, and extend from a bottom of the plurality of word line layers 616b to a top of the plurality of word line layers 616a.

FIG. 10C depicts an example top view of SGD layers of a block BLK0, where word line layers are shared among one undivided sub-block and two divided sub-blocks in each of regions 1050 and 1051. The concept of FIG. 10B1 is extended in this example. In a further extension of the concept (not shown), one undivided sub-block and more than two divided sub-blocks are used in a region between LIs.

A region 1050 of the block between local interconnects 800 and 801 comprises five SGD layers above shared word line layers. The region 1050 includes a first edge portion SB0a of a divided sub-block SB0 between the LI 800 and an IR 1060, a first portion SB1a of a divided sub-block SB1 between the IRs 1060 and 1061, a central or interior undivided sub-block SB2 between the IRs 1061 and 1062, a second portion SB1b of the divided sub-block SB1 between the IRs 1062 and 1063 and a second edge portion SB0b of the divided sub-block SB0 between the IR 1063 and the LI 801. The region 1051 includes a first edge portion SB3a of a divided sub-block SB3 between the LI 801 and an IR 1064, a first portion SB4a of a divided sub-block SB4 between the IRs 1064 and 1065, an interior undivided sub-block SB5 between the IRs 1065 and 1066, a second portion SB4b of the divided sub-block SB4 between the IRs 1066 and 1067 and a second edge portion SB3b of the divided sub-block SB3 between the IR 1067 and the LI 805.

As mentioned, each bit line is connected to one memory hole or string in each subset. For example, BL31 is connected to memory holes or strings 1070, 1071, 1072, 1073, 1074 and 1075 in SB2, SB1b, SB0b, SB5, SB4b and SB3b, respectively. This example differs from FIG. 10B1 in that there are twelve rows of memory strings between LIs instead of eight.

The thickness of the blocking oxide layers is similar (relatively thin) for R1 and R2 in SB0a, R11 and R12 in SB0b, R13 and R14 in SB3a, and R23 and R24 in SB3b. The thickness of the blocking oxide layers is similar (medium thickness, between relatively thin and relatively thick) for R3 and R4 in SB1a, R9 and R10 in SB1b, R15 and R16 in SB4a, and R21 and R22 in SB4b. The thickness of the blocking oxide layers is similar (relatively thick) for R5-R8 in SB2 and R17-R20 in SB5.

A conductive path 1040 connects the SGD layers of SB0a and SB0b, a conductive path 1041 connects the SGD layers of SB1a and SB1b, a conductive path 1042 connects the SGD layers of SB3a and SB3b, and a conductive path 1043 connects the SGD layers of SB4a and SB4b.

In one embodiment, in the region 1050, the memory strings are arranged in rows R1-R12, and a number of rows in the first and second edge portions together (e.g., four rows: R1 and R2 in first edge portion SB0a and R11 and R12 in second edge portion SB0b) is equal to a number of rows in the interior sub-block (e.g., four rows, R5-R8 in SB1). Also, the number of rows on one side of the interior sub-block, e.g. four rows R1-R4 is the same as the number of rows on the opposing side of the interior sub-block, e.g. four rows R9-R12. There is a symmetry about the interior sub-block.

FIG. 10C also shows that rows R1, R3 and R5 are at distances x1, x2 and x3, respectively from an edge 1083 of a word line layer and include example memory strings 1080, 1081 and 1082, respectively, connected to BL28.

FIG. 11A depicts an example threshold voltage (Vth) distribution of a set of memory cells connected to a word line, showing the effects of programming speed variations in a block, where four data states are used. For a set of cells which are programmed together, the Vth distributions 1120, 1121, 1122 and 1123 represent the erased (Er) state and programmed data states A, B and C, respectively, when the cells have significant programming speed variations, and the Vth distributions 1120a, 1121a, 1122a and 1123a represent the erased (Er) state and programmed data states A, B and C, respectively, when the cells have relatively small programming speed variations. In an erase operation, the erased state is reached when the Vth of the cells falls below a verify level VvEr. In a programming operation, the A, B and C states are reached when the Vth of the cells exceeds the verify level VvA, VvB or VvC, respectively. This example uses four data states. Other numbers of data states can be used as well, such as eight or sixteen. Read voltages VrA, VrB and VrC are used to read data from a set of cells having this Vth distribution.

In one approach, the memory cells store separate pages of data. For example, with four bits per cell as in this example, there will be a lower page and an upper page. The lower page is read using VrA and VrC and the upper page is read using VrB. An example encoding of bits for the Er, A, B and C states is 11, 10, 00 and 01, respectively, in the format of upper page (UP) bit/lower page (LP) bit.

When cells of one word line layer have different programming speeds, the number of programming loops increases. This is due to a large programming swing, which is the difference between the final program voltage and the initial program voltage. For example, the arrows 1100 and 1100a represent the programming swing when the cells have significant programming speed variations or relatively small programming speed variations, respectively. The programming swing is equal to the difference between the upper tail of the erase state Vth distribution (e.g., VvEr) and the upper tail of the Vth distribution of the highest programmed state. The cells having a Vth in the upper tail of the Vth distribution of the C state take the most program loops to program. Further, the number of verify operations for each programmed state is greater when the cells have significant programming speed variations. This also contributes to the increased number of program loops.

This situation results because a set of cells which is programmed together is constrained to use the same initial program voltage and step size. Instead, by programming a set of cells with similar programming speeds together, the initial program voltage and/or step size can be optimized for the set. See FIGS. 11D and 11E.

FIG. 11B depicts a waveform of an example programming operation comprising incremental step pulse programming (ISPP), where Vpgm_init is an initial program voltage and dVpgm is a step size. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages such as discussed in connection with FIG. 11A.

Each program voltage includes two steps, in one approach. Further, ISPP is used in this example, in which the program voltage steps up in each successive program loop using a fixed or varying step size. This example uses ISPP in a single programming pass in which the programming is completed. ISPP can also be used in each programming pass of a multi-pass operation.

The waveform 1100 includes a series of program voltages 1101, 1102, 1103, 1104, 1105, . . . 1106 that are applied to a word line selected for programming and to an associated set of non-volatile memory cells. The series of program voltages begins with an initial program voltage of Vpgm_init. Each successive program voltage may increase by a step size dVpgm. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 1110) may be applied after each of the program voltages 1101 and 1102. A-, B- and C-state verify voltages of VvA, VvB and VvC (waveform 1111) may be applied after each of the program voltages 1103 and 1104. After additional program loops, B- and C-state verify voltages of VvB and VvC (waveform 1112) may be applied after the final program voltage 1106.

A programming operation can use one or more programming passes. A one pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vpass (e.g., 8-10 V), is applied to the remaining word lines. By testing whether the Vth of a given memory cell is above or below one or more of the read voltages, the system can determine the data state which is represented by a memory cell. These read voltages are demarcation voltages because they demarcate between Vth ranges of different data states.

FIG. 11C depicts a plot of Vpgm_init for memory cells versus a distance of the row in which the memory cells are located from an edge of a WLL. Vpgm_init can be set to be relatively higher when the distance from the edge of the WLL is relatively greater. By setting Vpgm_init to be relatively higher for a memory string when the programming speed is relatively lower, the programming of the slow cells is sped up to the level of the fast cells, and the programming of all cells can be completed in a same number of program loops. Optionally, dVpgm can be set to be relatively higher for a memory string when the programming speed is relatively lower. In some cases, it is sufficient to adjust Vpgm_init while using a same dVpgm for the different subsets. In practice, the plot of FIG. 11C can be realized by providing a table which associates an optimum value of Vpgm_init with each sub-block. See FIGS. 11D and 11E.

Another approach involves setting a higher maximum allowable number of program loops for a program operation when the program speed is relatively low, e.g., for the interior sub-block. Another approach involves adjusting erase voltages so that a higher initial erase voltage is used for the interior sub-block compared to the edge sub-block portions. The erase process can use a series of erase voltages similar to the program voltages of FIG. 11B.

FIG. 11D depicts an example table which associates an optimum value of Vpgm_init with each sub-block of FIG. 10B1. A low value of Vpgm_init, e.g., Vpgm_init_low, is used for SB0 (comprising SB0a and SB0b) and SB2 (comprising SB2a and SB2b). A high value of Vpgm_init, e.g., Vpgm_init_high, is used for SB1 and SB3.

FIG. 11E depicts an example table which associates an optimum value of Vpgm_init with each sub-block of FIG. 10C. Vpgm_init_low is used for SB0 (comprising SB0a and SB0b) and SB3 (comprising SB3a and SB3b). A medium value of Vpgm_init, e.g., Vpgm_init_medium, is used for SB1 (comprising SB1a and SB1b) and SB4 (comprising SB4a and SB4b). Vpgm_init_high is used for SB2 and SB5. Vpgm_init_high>Vpgm_init_medium>Vpgm_init_low.

Figure 12A:
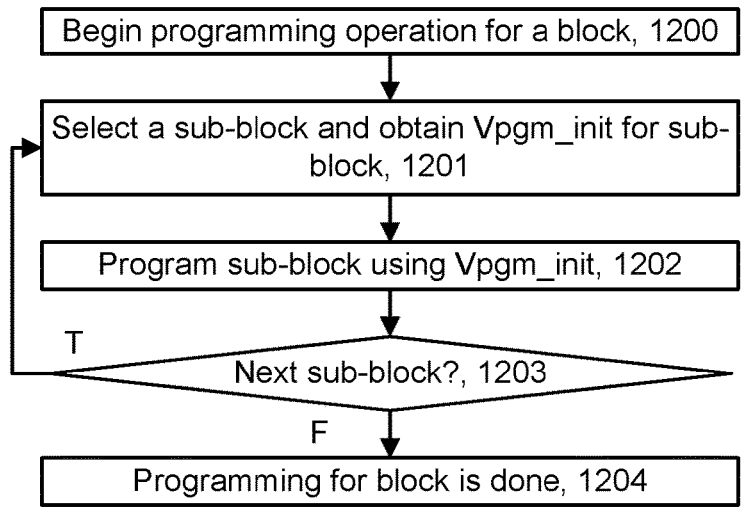
FIG. 12A depicts an example process for programming a block to provide uniform programming speeds.

FIG. 12A depicts an example process for programming a block to provide uniform programming speeds. Step 1200 begins a programming operation for a block. Step 1210 includes selecting a sub-block and obtaining Vpgm_init for the sub-block, e.g., based on FIG. 11C. Step 1202 includes programming the sub-block using Vpgm_init. This can involve programming memory cells connected to one or more word lines. See also FIG. 12B. A decision step 1203 determines whether there is a next sub-block to program in the block. If decision step 1203 is true, step 1201 is repeated for the next sub-block. If decision step 1203 is false, step 1204 indicates that the programming for the block is done.

Figure 12B:
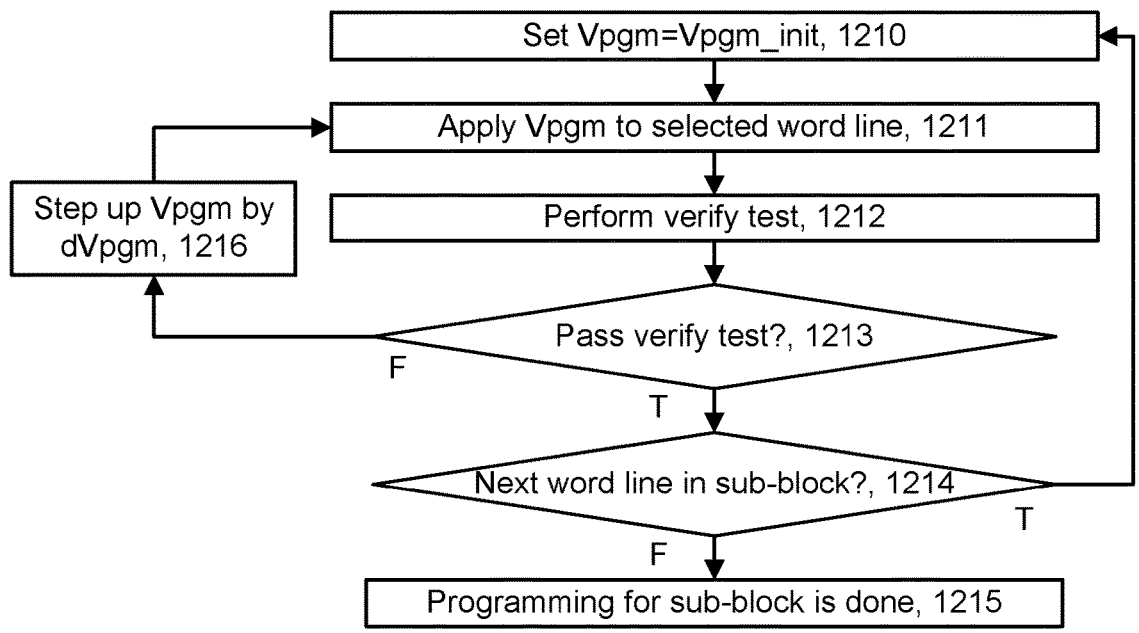
FIG. 12B depicts an example process for programming a sub-block consistent with step 1202 of FIG. 12A.

FIG. 12B depicts an example process for programming a sub-block consistent with step 1202 of FIG. 12A. Step 1210 includes setting Vpgm=Vpgm_init, the optimized initial program voltage for the sub-block. Step 1211 includes applying Vpgm to a selected word line. Step 1212 includes performing a verify test for the selected memory cells connected to the selected word line. A decision step 1213 determines whether the selected memory cells pass the verify test. If decision step 1213 is false, step 1216 steps up Vpgm by dVpgm and a next program loops is performed at step 1211. If decision step 1213 is true, a decision step 1214 determines whether there is a next word line in the sub-block to program. If decision step 1214 is true, the process is repeated beginning at step 1210. If decision step 1214 is false, step 1215 indicates that the programming of the sub-block is done.

Figure 13:
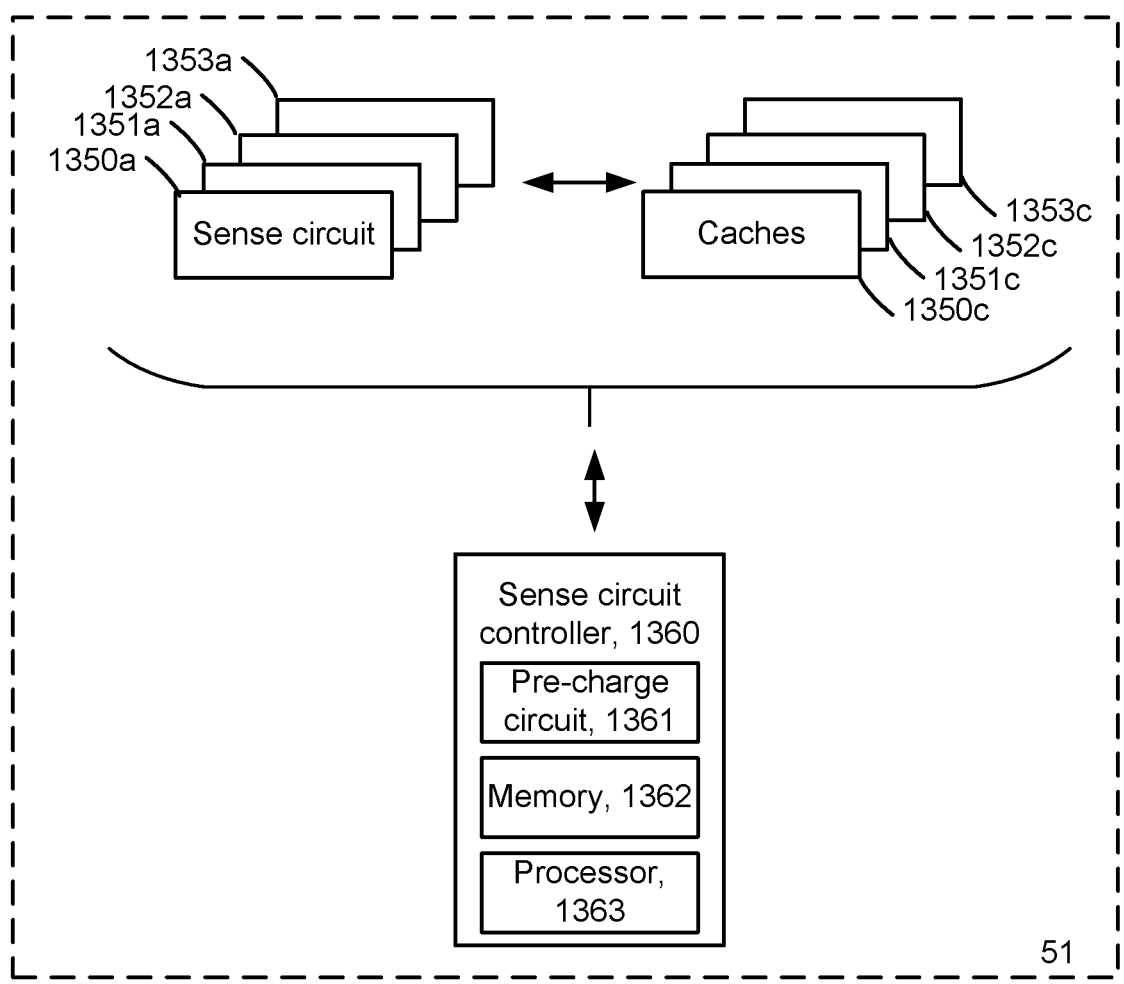
FIG. 13 depicts an example block diagram of a sense block 51 in the column control circuitry of FIG. 1.

FIG. 13 depicts an example block diagram of a sense block 51 in the column control circuitry of FIG. 1. The column control circuitry can include multiple sense blocks, where each sense block performs sensing, e.g., read, program verify or erase verify operations for multiple memory cells via respective bit lines.

In one approach, a sense block comprises multiple sense circuits, also referred to as sense amplifiers. Each sense circuit is associated with data latches and caches. For example, the example sense circuits 1350a, 1351a, 1352a and 1353a are associated with caches 1350c, 1351c, 1352c and 1353c, respectively.

In one approach, different subsets of bit lines can be sensed using different respective sense blocks. This allows the processing load which is associated with the sense circuits to be divided up and handled by a respective processor in each sense block. For example, a sense circuit controller 1360 can communicate with the set, e.g., sixteen, of sense circuits and latches. The sense circuit controller may include a pre-charge circuit 1361 which provides a voltage to each sense circuit for setting a pre-charge voltage. The sense circuit controller may also include a memory 1362 and a processor 1363.

Figure 14:
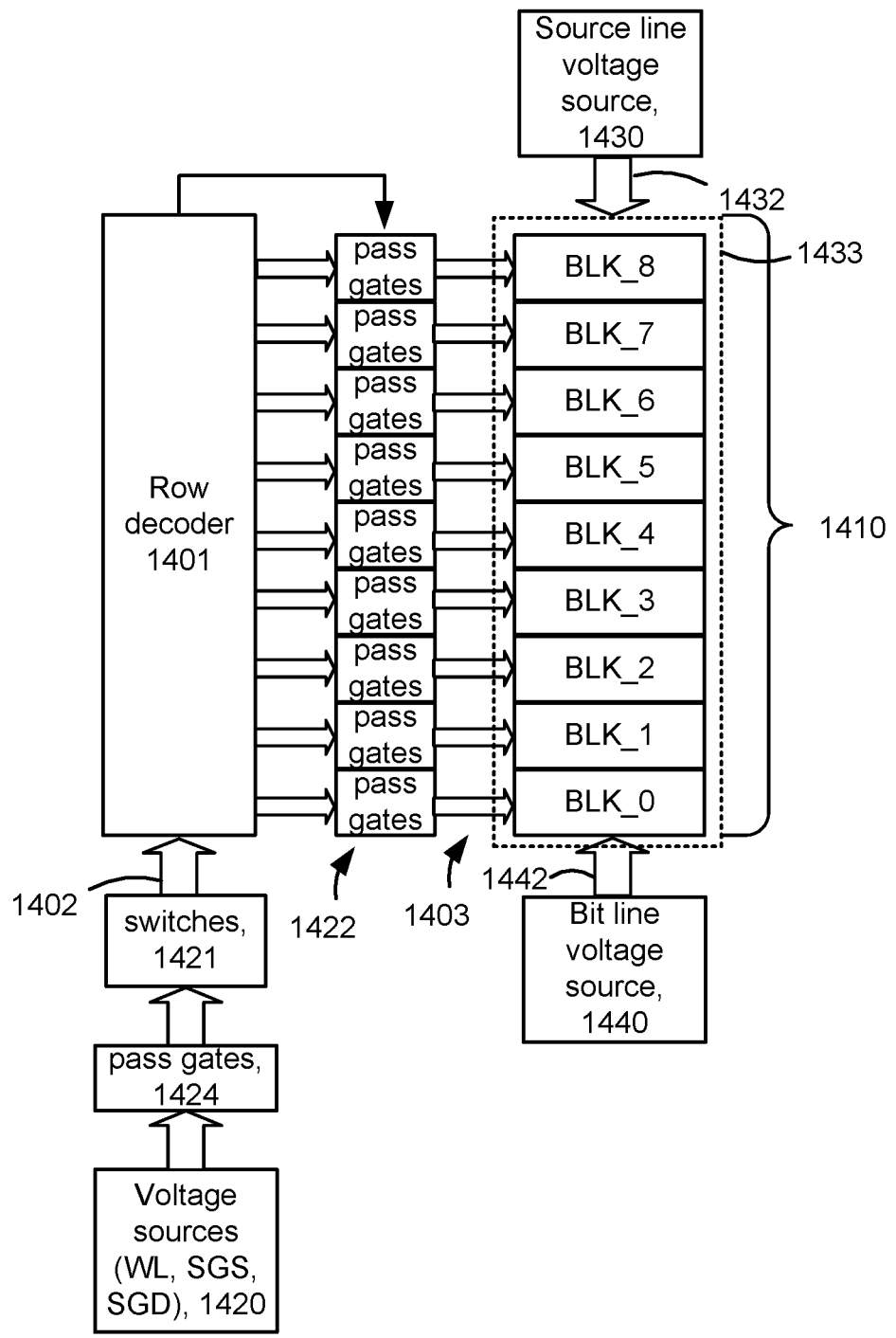
FIG. 14 depicts an example circuit for providing voltages to blocks of memory cells.

FIG. 14 depicts an example circuit for providing voltages to blocks of memory cells. In this example, a row decoder 1401 provides voltages to word lines and select gates of each block in set of blocks 1410. The set could be in a plane and includes blocks BLK0 to BLK8, consistent with FIG. 9B. The row decoder provides a control signal to pass gates 1422 which connect the blocks to the row decoder. Typically, operations, e.g., program, read or erase, are performed on one selected block at a time. The row decoder can connect global control lines 1402 to local control lines 1403. The control lines represent conductive paths. Voltages are provided on the global control lines from voltage sources 1420. The voltage sources may provide voltages to switches 1421 which connect to the global control lines. Pass gates 1424, also referred to as pass transistors or transfer transistors, are controlled to pass voltages from the voltage sources 1420 to the switches 1421.

The voltage sources 1420 can provided voltages on word lines (WL), SGS control gates and SGD control gates, for example.

The various components, including the row decoder, may receive commands from a controller such as the state machine 112 or the controller 122 to perform the functions described herein.

A source line voltage source 1430 provides a voltage to the source lines/diffusion region in the substrate via control lines 1432. In one approach, the source diffusion region 1433 is common to the blocks. A set of bit lines 1442 is also shared by the blocks. A bit line voltage source 1440 provides voltages to the bit lines. In one possible implementation, the voltage sources 1420 are near the bit line voltage source.

In one embodiment, a memory device comprises: a plurality of word line layers which are vertically spaced apart from one another by dielectric layers; a set of memory strings extending through the plurality of word line layers, the set of memory strings comprises memory strings in an interior sub-block, memory strings in a first edge portion of a divided sub-block and memory strings in a second edge portion of the divided sub-block, wherein the interior sub-block is between the first and second edge portions; a first set of bit lines connected to the memory strings of the first edge portion and the memory strings of the interior sub-block but not to the memory strings of the second edge portion; and a second set of bit lines connected to the memory strings of the second edge portion and the memory strings of the interior sub-block but not to the memory strings of the first edge portion.

In another embodiment, a memory device comprises: a set of memory strings which extends through a plurality of word line layers, wherein the plurality of word line layers are vertically spaced apart from one another by dielectric layers, the set of memory strings comprises one row of memory strings (e.g., R1 in FIG. 10C) at one distance (x1) from a first edge of the plurality of word line layers and another row (R3) of memory strings at another distance (x2) from the first edge of the plurality of word line layers, greater than the one distance; and means for programming the one row of memory strings using incremental step pulse programming with one initial program voltage (Vpgm_init_low) and to separately program the another row of memory strings using incremental step pulse programming with another initial program voltage (Vpgm_init_medium), higher than the one initial program voltage.

The above device may further include a set of bit lines (BL0-BL31), where each bit line in the set of bit lines is connected to a memory string, e.g., 1080, in the one row of memory strings and to a memory string, e.g., 1081, in the another row of memory strings.

In the above device: the set of memory strings comprises an additional row (e.g., R5 in FIG. 10C) of memory strings at a distance (x3) from the first edge of the plurality of word line layers which is greater than the another distance (x2); and the means for programming is configured to program the additional row of memory strings using incremental step pulse programming with an initial program voltage (Vpgm_init_high) which is higher than the another initial program voltage, separately from the programming of the one row of memory strings and the another row of memory strings.

The above device may further include a set of bit lines, each bit line in the set of bit lines is connected to a memory string in the one row of memory strings, e.g., 1080, to a memory string in the another row of memory strings, e.g., 1081, and to a memory string in the additional row of memory strings, e.g., 1082.

In the above device: the set of memory strings comprises an additional row (R12 in FIG. 10C) of memory strings at the one distance (x1) from a second edge of the plurality of word line layers, opposite the first edge; and the means for programming is configured to program the additional row of memory strings concurrently with the one row of memory strings using the incremental step pulse programming with the one initial program voltage (Vpgm_init_low).

In the above device, the incremental step pulse programming of the one row of memory strings and the incremental step pulse programming of the another row of memory strings use a common program voltage step size (dVpgm).

The means described above can include the components of the memory device 100 of FIG. 1, for example. The power control module 116, for instance, controls the power and voltages supplied to the word lines, select gate lines and bit lines during memory operations. Moreover, the means described above can include the components of FIG. 14 including the decoders, voltage drivers, switches and pass transistors. The means can further include any of the control circuits in FIG. 1 such as the control circuitry 110 and controller 122.

In another embodiment, a method for programming in a memory device comprises: concurrently programming first and second edge portions of a divided sub-block in a set of memory strings, wherein the set of memory strings extends through a plurality of word line layers which are vertically spaced apart from one another by dielectric layers; and separate from the concurrently programming the first and second edge portions, programming an interior sub-block in the set of memory strings, wherein the interior sub-block is between the first and second edge portions.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A memory device, comprising:
a set of NAND strings which extends through a plurality of word line layers, wherein the plurality of word line layers are vertically spaced apart from one another by dielectric layers in a stack, the set of NAND strings comprises one row of NAND strings at one distance from a first edge of the plurality of word line layers and another row of NAND strings at another distance from the first edge of the plurality of word line layers, greater than the one distance; and
a control circuit configured to program the one row of NAND strings and to separately program the another row of NAND strings, wherein the control circuit is configured to program the one row of NAND strings using incremental step pulse programming with one initial program voltage and to program the another row of NAND strings using incremental step pulse programming with another initial program voltage which is higher than the one initial program voltage.

2. The memory device of claim 1, wherein:
the control circuit is configured to perform the incremental step pulse programming of the one row of NAND strings and the incremental step pulse programming of the another row of NAND strings use a common program voltage step size.

3. The memory device of claim 1, wherein:
the control circuit is configured to program the one row of NAND strings using incremental step pulse programming with one step size and to program the another row of NAND strings using incremental step pulse programming with another step size which is different than the one step size.

4. The memory device of claim 1, further comprising:
a set of bit lines, each bit line in the set of bit lines is connected to a NAND string in the one row of NAND strings and to a NAND string in the another row of NAND strings.

5. The memory device of claim 1, wherein:
the set of NAND strings comprises an additional row of NAND strings at a distance from the first edge of the plurality of word line layers which is greater than the another distance; and
the control circuit is configured to program the additional row of NAND strings separately from the programming of the one row of NAND strings and the programming of the another row of NAND strings.

6. The memory device of claim 5, wherein:
the control circuit is configured to program the additional row of NAND strings using incremental step pulse programming with an additional initial program voltage which is higher than the another initial program voltage.

7. The memory device of claim 5, further comprising:
a set of bit lines, each bit line in the set of bit lines is connected to a NAND string in the one row of NAND strings, to a NAND string in the another row of NAND strings and to a NAND string in the additional row of NAND strings.

8. The memory device of claim 1, wherein:
the set of NAND strings comprises an additional row of NAND strings at the one distance from a second edge of the plurality of word line layers, opposite the first edge; and
the control circuit is configured to program the additional row of NAND strings concurrently with the programming of the one row of NAND strings.

9. The memory device of claim 8, wherein:
the control circuit is configured to program the additional row of NAND strings using the incremental step pulse programming with the one initial program voltage.

10. The memory device of claim 8, wherein:
the one row of NAND strings comprise select gate transistors connected to one another;
the another row of NAND strings comprise select gate transistors connected to one another;
the additional row of NAND strings comprise select gate transistors connected to one another;
the select gate transistors of the one row of NAND strings are connected to the select gate transistors of the additional row of NAND strings; and
the select gate transistors of the one row of NAND strings are not connected to the select gate transistors of the another row of NAND strings.

11. The memory device of claim 1, further comprising:
an isolation area extending through the stack adjacent to the first edge.

12. The memory device of claim 1, wherein:
a thickness of a block oxide layer in the NAND strings of the one row of NAND strings is less than a thickness of a block oxide layer in the NAND strings of the another row of NAND strings.

13. A method for programming in a memory device, comprising:
concurrently programming a first edge row of NAND strings and a second edge row of NAND strings in a stacked memory device, the stacked memory device comprising alternating conductive layers and dielectric layers; and
separate from the concurrently programming the first edge row of NAND strings and the second edge row of NAND strings, programming an interior row of NAND strings in the stacked memory device, wherein the interior row of NAND strings is between the first edge row of NAND strings and the second edge row of NAND strings.

14. The method of claim 13, wherein:
the first edge row of NAND strings and the second edge row of NAND strings are in one sub-block of a block; and
the interior row of NAND strings is in another sub-block of the block.

15. The method of claim 13, wherein:
the concurrently programming the first edge row of NAND strings and the second edge row of NAND strings uses incremental step pulse programming with a first initial program voltage; and
the programming the interior row of NAND strings uses incremental step pulse programming with a second initial program voltage, higher than the first initial program voltage.

16. The method of claim 15, wherein:
the incremental step pulse programming of the concurrently programming the first edge row of NAND strings and the second edge row of NAND strings, and the incremental step pulse programming of the programming the interior row of NAND strings, use a common program voltage step size.

17. A memory device, comprising:
a plurality of word line layers which are vertically spaced apart from one another by dielectric layers in a sub-block of a block, the sub-block having opposing first and second edges and an interior region between the first and second edges;
a plurality of NAND strings extending vertically through the sub-block, the plurality of NAND strings comprising edge NAND strings adjacent to the first and second edges and interior NAND strings between the edge NAND strings;
means for concurrently programming the first and second edge NAND strings; and
means for programming the interior NAND strings separately from the programming of the first and second edge NAND strings.

18. The memory device of claim 17, wherein:
a programming parameter used in the programming of the first and second edge NAND strings is different than a programming parameter used in the programming of the interior NAND strings.

19. The memory device of claim 17, wherein:
an initial program voltage used in the programming of the first and second edge NAND strings is different than an initial program voltage used in the programming of the interior NAND strings.

* * * * *